US011815955B2

(12) United States Patent
Abe et al.

(10) Patent No.: US 11,815,955 B2
(45) Date of Patent: Nov. 14, 2023

(54) DISPLAY DEVICE, FLEXIBLE WIRING BOARD, AND MANUFACTURING METHOD OF DISPLAY DEVICE

(71) Applicant: Japan Display Inc., Tokyo (JP)

(72) Inventors: Hideaki Abe, Tokyo (JP); Kazuyuki Yamada, Tokyo (JP); Keisuke Asada, Tokyo (JP); Kota Uogishi, Tokyo (JP)

(73) Assignee: Japan Display Inc., Tokyo (JP)

( * ) Notice: Subject to any disclaimer, the term of this patent is extended or adjusted under 35 U.S.C. 154(b) by 190 days.

(21) Appl. No.: 17/451,050

(22) Filed: Oct. 15, 2021

(65) Prior Publication Data
US 2022/0035411 A1 Feb. 3, 2022

Related U.S. Application Data

(63) Continuation of application No. PCT/JP2020/009367, filed on Mar. 5, 2020.

(30) Foreign Application Priority Data

Apr. 16, 2019 (JP) .................................. 2019-077911

(51) Int. Cl.
*H05K 5/00* (2006.01)
*G06F 1/16* (2006.01)
(Continued)

(52) U.S. Cl.
CPC ............ *G06F 1/1652* (2013.01); *G06F 1/183* (2013.01); *G06F 1/189* (2013.01); *H05K 1/189* (2013.01); *H05K 2201/10128* (2013.01)

(58) Field of Classification Search
CPC ........ G06F 1/1652; G06F 1/183; G06F 1/189; H05K 2201/10128
(Continued)

(56) References Cited

U.S. PATENT DOCUMENTS 9,560,761 B2 * 1/2017 Kishida .................. H05K 1/147
10,955,712 B2 * 3/2021 Ueno ................... G02F 1/13452
(Continued)

FOREIGN PATENT DOCUMENTS

JP 2008-096866 A 4/2008
JP 2008-298828 A 12/2008
(Continued)

OTHER PUBLICATIONS

International Search Report dated Jun. 2, 2020 in PCT/JP2020/009367 filed on Mar. 5, 2020, 3 pages.

*Primary Examiner* — Binh B Tran
(74) *Attorney, Agent, or Firm* — Maier & Maier, PLLC

(57) ABSTRACT

According to one embodiment, a display device including a display panel including a mount side curved to correspond to the curved shape of a display surface, a flat circuit board, and a first flexible wiring board mounted on the display panel in a first end side while being connected to the circuit board in a second end side, wherein the first flexible wiring board includes a first base member including a first surface and a second surface, a first line positioned in the first surface side, and a first protection layer covering the first line, and includes a first bending part to be bent between a first bending boundary and a second bending boundary, the second bending boundary is inclined with respect to the first bending boundary, and the first base member includes a first groove positioned in the first bending part and formed in the second surface.

16 Claims, 19 Drawing Sheets

(51) Int. Cl.
*G06F 1/18* (2006.01)
*H05K 1/18* (2006.01)

(58) Field of Classification Search
USPC .................................................. 361/679.01
See application file for complete search history.

(56) References Cited

U.S. PATENT DOCUMENTS

2005/0245078 A1* 11/2005 Ohnuma ............. H01L 27/1292
 438/672
2008/0088768 A1 4/2008 Kohno
2015/0189755 A1 7/2015 Choi
2019/0252298 A1* 8/2019 Hsieh .................... H01L 23/562

FOREIGN PATENT DOCUMENTS

JP 2016-103516 A 6/2016
JP 2018-169541 A 11/2018

* cited by examiner

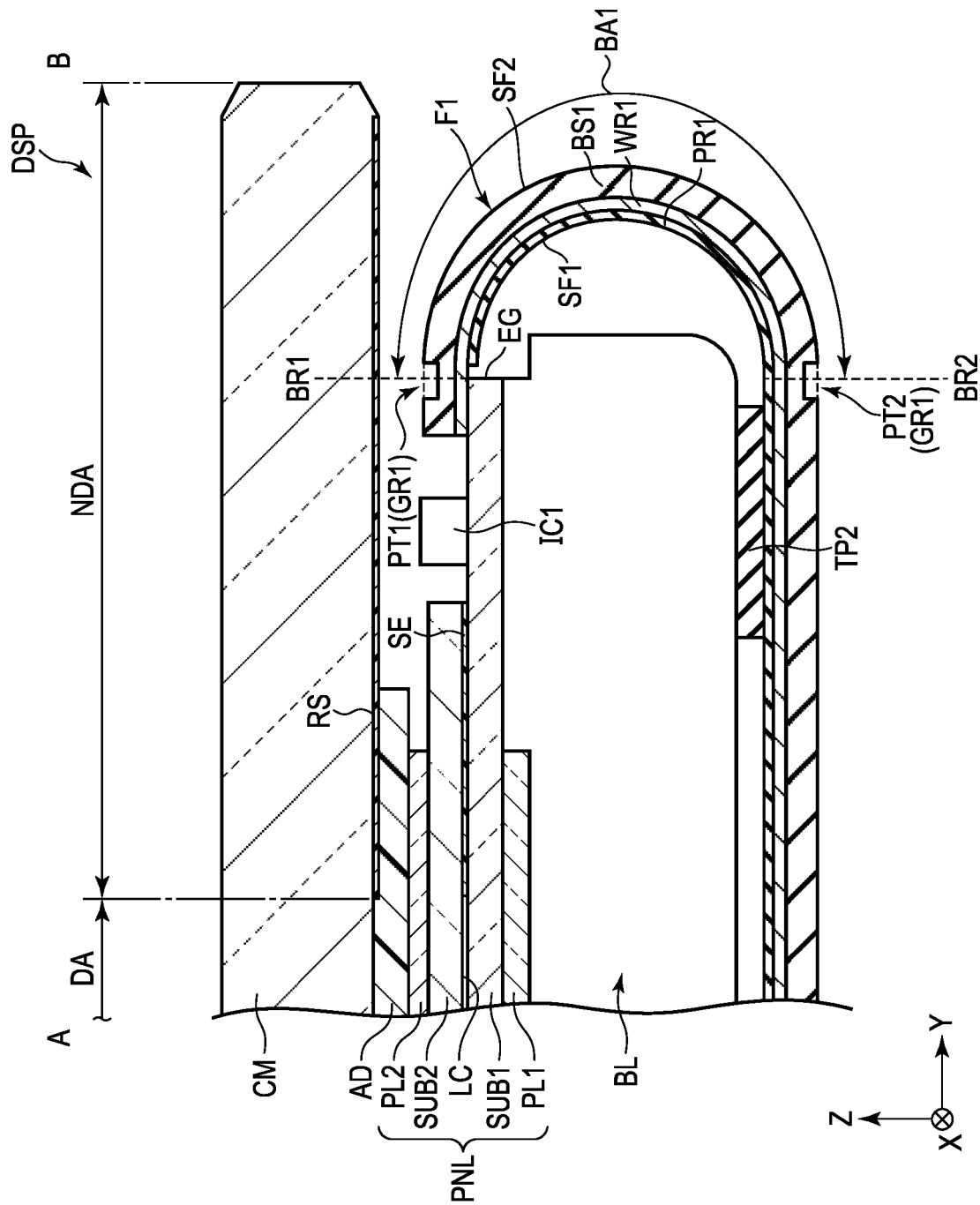
F I G. 8

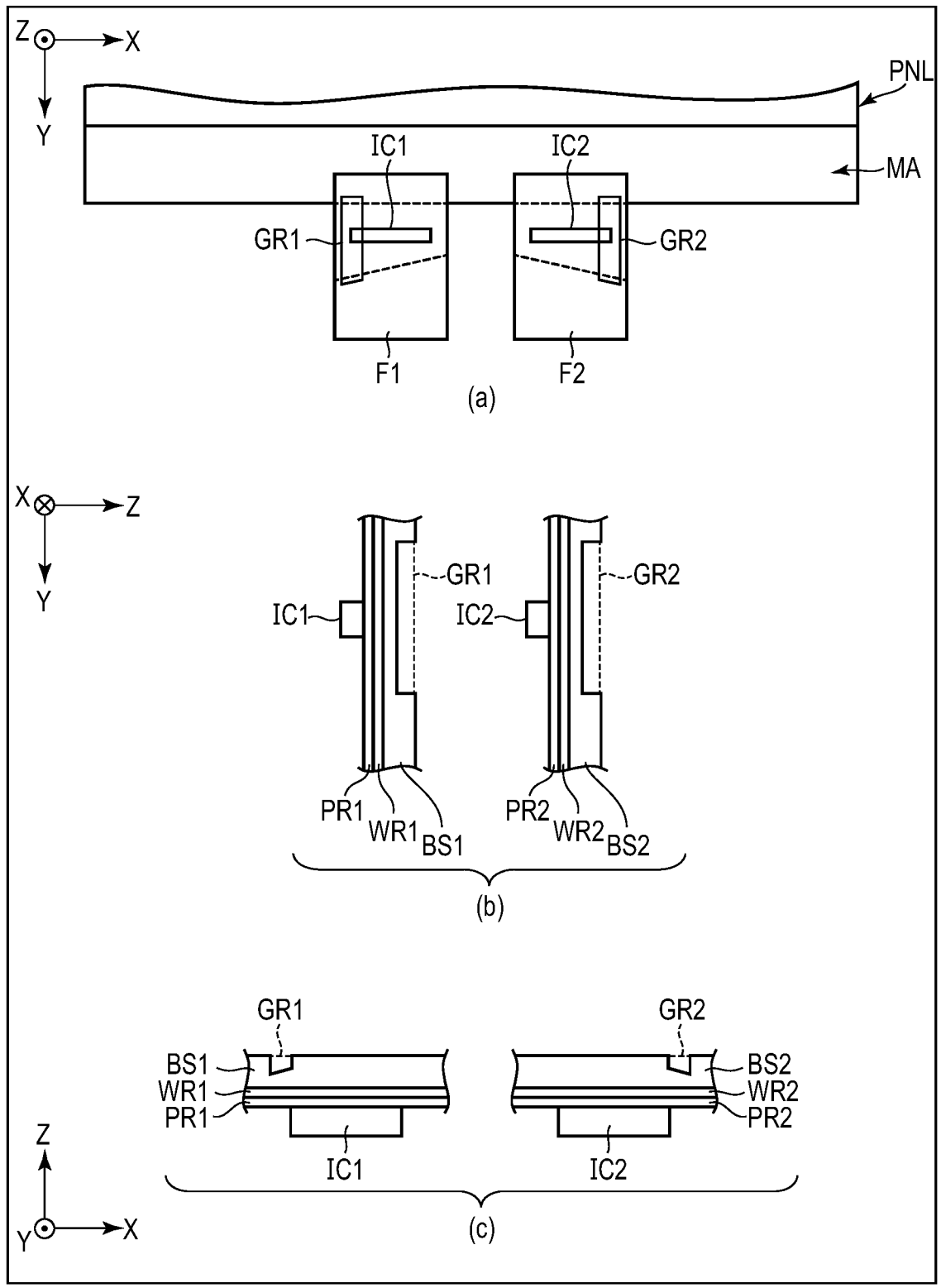
F I G. 16

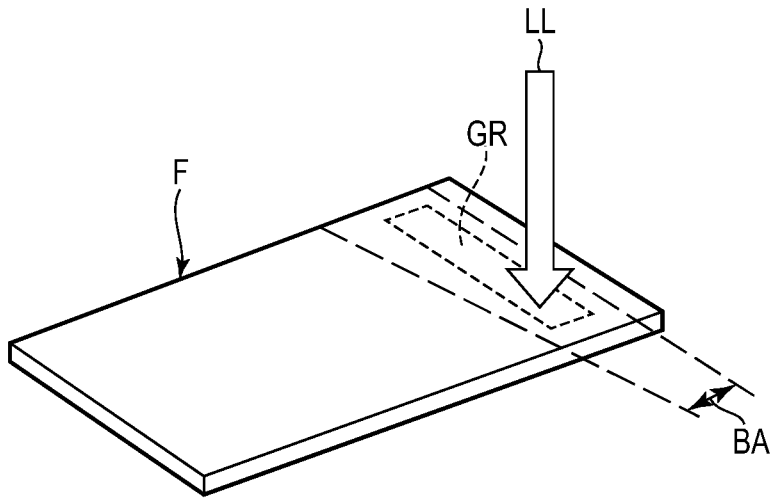
F I G. 19
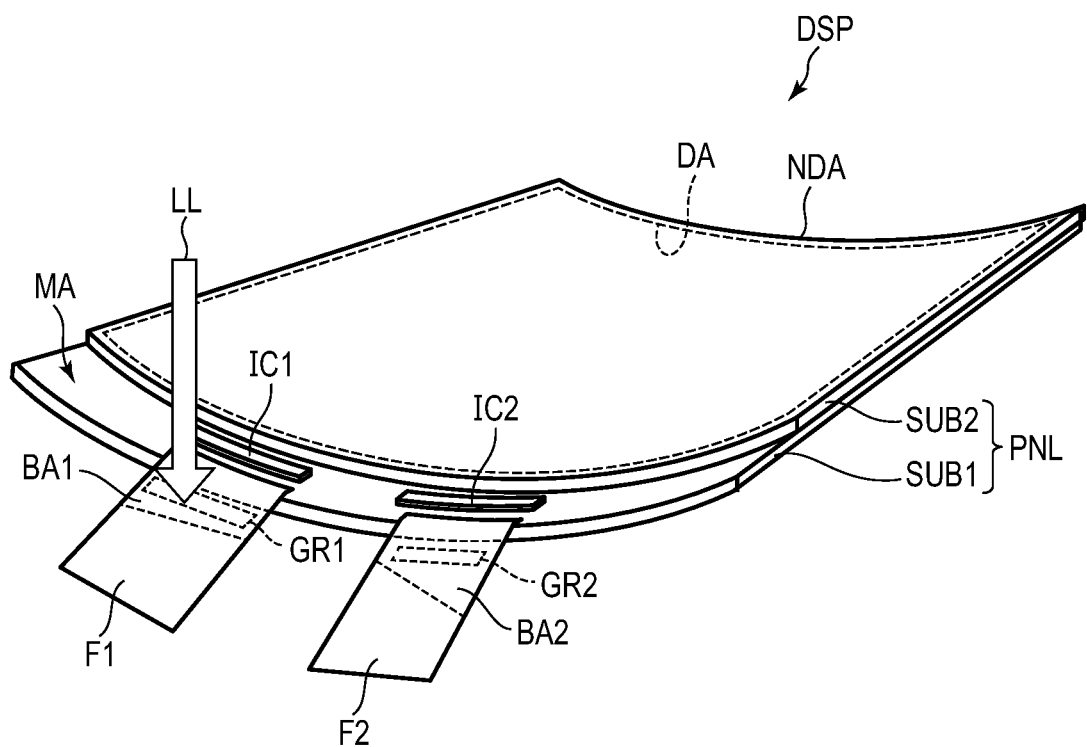
F I G. 20

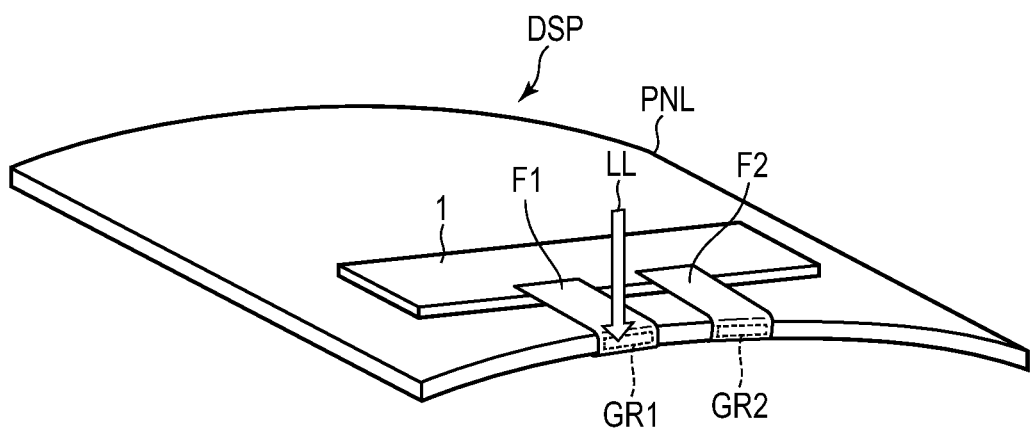
F I G. 21

DISPLAY DEVICE, FLEXIBLE WIRING BOARD, AND MANUFACTURING METHOD OF DISPLAY DEVICE

CROSS-REFERENCE TO RELATED APPLICATIONS

This application is a Continuation Application of PCT Application No. PCT/JP2020/009367, filed Mar. 5, 2020 and based upon and claiming the benefit of priority from Japanese Patent Application No. 2019-077911, filed Apr. 16, 2019, the entire contents of all of which are incorporated herein by reference.

FIELD

Embodiments described herein relate generally to a display device, a flexible wiring board, and a manufacturing method of the display device.

BACKGROUND

Display devices including a curved display screen are known. Such a display device includes a curved display panel, flat circuit board, and flexible circuit connecting a curved side of the display panel and the flat circuit board. The flexible circuit has an end mounted on the display panel is curved along the curved side and an end mounted on the circuit board which is not curved. The flexible circuit includes a pair of slit recesses which is recessed in a slit-shape from each side edge to the inner side. With such slit recesses, twist of the flexible circuit is absorbed, and thus, peeling-off of the mount parts can be suppressed and security of connection can be improved.

BRIEF DESCRIPTION OF THE DRAWINGS

FIG. 8 is a cross-sectional view of a flexible wiring board of a second embodiment.

FIG. 16 is a diagram illustrating a flexible wiring board of a second variant of the sixth embodiment.

FIG. 19 is a diagram illustrating a second example of the process of forming a groove in a flexible wiring board.

FIG. 20 is a diagram illustrating a third example of the process of forming a groove in a flexible wiring board.

FIG. 21 is a diagram illustrating a fourth example of the process of forming a groove in a flexible wiring board.

DETAILED DESCRIPTION

Figure 1:
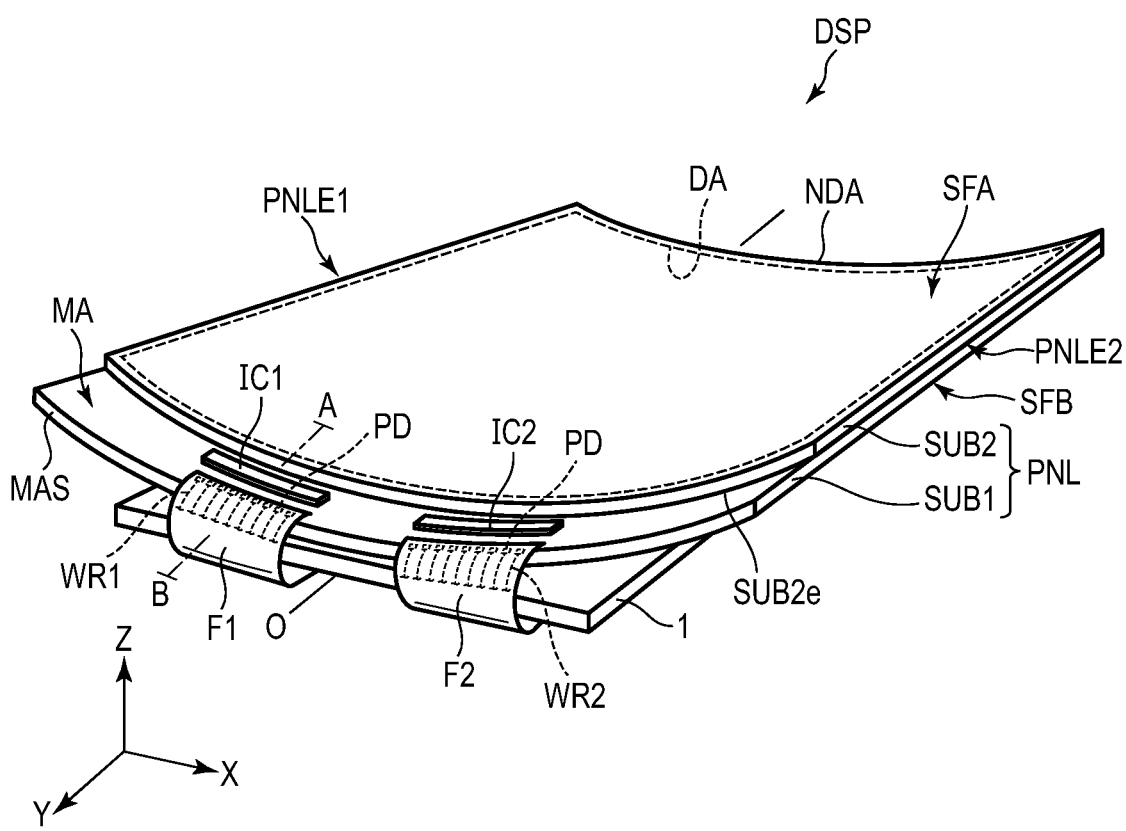
FIG. 1 is a perspective view of a display device of an embodiment.

In general, according to one embodiment, a display device comprises a display panel including a curved display surface, a mount side curved to correspond to the curved shape of the display surface, and a plurality of pad parts aligned along the mount side, a flat circuit board opposed to a surface opposite to the display surface of the display panel, and a first flexible wiring board including a first end and a second end which is opposite to the first end, the first flexible wiring board mounted on the display panel and connected to the pad part in the first end side while being connected to the circuit board in the second end side, wherein the first flexible wiring board includes a first base member including a first surface and a second surface opposite to the first surface, a first line positioned in the first surface side of the first base member, and a first protection layer covering the first line, and includes a first bending part to be bent between a first bending boundary in the first end side and a second bending boundary in the second end side, an extension direction of the second bending boundary is inclined with respect to an extension direction of the first bending boundary, and the first base member includes a first groove positioned in the first bending part and formed in the second surface.

According to another embodiment, a flexible wiring board comprises a first end, a second end in the opposite side of the first end, a first base member including a first surface and a second surface opposite to the first surface, a first line positioned in the first surface side of the first base member, a first protection layer covering the first line, and a first bending part bent between a first bending boundary in the first end side and a second bending boundary in the second end side, wherein an extension direction of the second bending boundary is inclined with respect to an extension direction of the first bending boundary, and the first base member includes a first groove positioned in the first bending part and formed in the second surface.

According to still another embodiment, a manufacturing method of a display device, the display device includes a display panel including a curved display surface, a mount side curved to correspond to the curved shape of the display surface, and a plurality of pad parts aligned along the mount side, a flat circuit board opposed to a surface opposite to the display surface of the display panel, and a flexible wiring board including a first end, a second end in the opposite side of the first end, a first side edge extending from the first end to the second end, and a second side edge positioned in the opposite side of the first side edge and extending from the first end to the second end, the flexible wiring board mounted on the display panel in the first end side to be connected to the pad part, and connected to the circuit board in the second end side, wherein the flexible wiring board includes a base member including a first surface and a second surface opposite to the first surface, a first line positioned in the first surface side of the base member, and a protection layer covering the first line, and includes a bending part to be bent between a first bending boundary in the first end side and a second bending boundary in the second end side, and an extension direction of the second bending boundary is inclined with respect to an extension direction of the first bending boundary, wherein the base member includes a first bezel area along the first side edge and a second bezel area along the second side edge, the method comprising: forming a groove, by laser, in the second surface of the base member to be positioned in the bending part after mounting the flexible wiring board on the display panel, between the first bezel area and the second bezel area; and bending the bending part of the flexible wiring board after the forming of the groove in the base member.

Embodiments will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same elements as those described in connection with preceding drawings are denoted by like reference numerals, and a detailed description thereof is omitted unless otherwise necessary.

Now, a first embodiment will be explained with reference to FIGS. 1 to 4.

FIG. 1 is a perspective view of a display device DSP of an embodiment.

The main structure of the present embodiment can be used in electronic devices including a flexible wiring board such as a display device, and especially, can be applied to the electronic devices with a curved surface and a flexible wiring board mounted on a curved side. It is also applicable to electronic devices such as a touch panel and a finger print sensor. In the present application, structures of the present embodiment applied to a display device will be explained for example. The display device will be used in various devices such as smartphone, tablet terminal, mobile phone, clamshell personal computer, in-car device, and gaming device. Furthermore, the present embodiment can be applied to various display devices such as liquid crystal display device, spontaneous light emitting display device such as organic electroluminescent display device, micro LED display device, electron paper display device including electrophoretic devices, micro-electromechanical systems (MEMS) display device, and electrochromism-applied display device.

For example, a first direction X, a second direction Y and a third direction Z are orthogonal to each other, but may intersect at an angle other than ninety degrees. The first direction X and the second direction Y correspond to directions parallel to a main surface of a substrate which constitutes the display device DSP, and the third direction Z corresponds to a thickness direction of the display device DSP. In the following descriptions, a direction forwarding a tip of an arrow indicating the third direction Z is referred to as "upward" and a direction forwarding oppositely from the tip of the arrow is referred to as "downward". With such expressions "a second member above a first member" and "a second member below a first member", the second member may be in contact with the first member or may be remote from the first member.

Furthermore, seeing an X-Y plan defined by the first direction X and the second direction Y from the tip side of the arrow indicating the third direction Z will be referred to as plan view.

The display device DSP includes an active matrix display panel PNL, flexible wiring boards F1 and F2, circuit board 1, and IC chips IC1 and IC2.

The display panel PNL includes ends PNLE1 and PNLE2 extending along the second direction Y. Furthermore, in the display panel PNL, a center position with respect to the width of the first direction X is given origin O. The display panel PNL is curved such that the ends PNLE1 and PNLE2 are positioned above the origin O. Furthermore, the display panel PNL includes a display surface SFA to display an image and a surface SFB opposite to the display surface SFA. The display surface SFA and the surface SFB are curved. The display panel PNL includes a mount side MAS curved along the curved shape of the display surface SFA.

The display panel PNL includes a first substrate SUB1 and a second substrate SUB2 opposed to the first substrate SUB1. The first substrate SUB1 and the second substrate SUB2 are each curved. The first substrate SUB1 and the second substrate SUB2 are adhered to each other by a sealant. The first substrate SUB1 and the second substrate sSUB2 are formed of a transparent insulating substrate such as a glass plate or a resin plate. Furthermore, the first substrate SUB1 includes a mount MA which does not overlap with the second substrate SUB2. The mount MA is positioned between an end SUB2e of the second substrate SUB2 and the mount side MAS. The first substrate SUB1 includes a plurality of pad parts PD arranged along the mount side MAS. Note that, in the present embodiment, the upper surface of the mount side MAS is included in the display surface SFA. Furthermore, in the example depicted, the display panel PNL is formed such that the width in the first direction X is greater than the width in the second direction Y; however, the width in the direction Y may be greater than the width of the first direction X.

The display panel PNL includes a display area DA in which an image is displayed, and a non-display area NDA surrounding the display area DA. The display panel PNL includes a transmissive display function which displays an image by selectively passing the light from the backlight unit to the display area DA. Note that, the display device DSP may not include a backlight unit, and the display panel PNL may be a transmissive type including a transmissive display function to display an image by selectively passing light from the lower surface side of the first substrate SUB1, or a reflective type including a reflective display function to display an image by selectively reflecting light from the upper surface side of the second substrate SUB2, or a transflective type including both the transmissive display function and the reflective display function.

Furthermore, full details of the display panel PNL may not be explained in the present application, however, note that the display panel PNL may include a display mode using a horizontal field along the main surface of the substrate, or display mode using a vertical field along the normal of the main surface of the substrate, or display mode using an inclined field inclined with respect to the main surface of the substrate, or display mode using an arbitrary combination of the horizontal field, vertical field, and inclined field modes.

The circuit board 1 is flat, and is opposed to the surface SFB. The width of the circuit board 1 in the first direction X is narrower than the width of the display panel PNL in the first direction X. The width of the circuit board 1 in the second direction Y is narrower than the width of the display panel PNL in the second direction Y. The flexible wiring boards F1 and F2 are mounted on the mount MA of the display panel PNL, and overlap with the pad parts PD. Furthermore, the flexible wiring board F1 includes a plurality of lines WR1 connected to the pad parts PD. The flexible wiring board F2 includes a plurality of lines WR2 connected to the pad parts PD. The flexible wiring boards F1 and F2 are each mounted on the circuit board 1 in the end opposite to the end mounted on the mount MA. Furthermore, the flexible wiring board F1 is positioned closer to the end PNLE1 than is the origin O while the flexible wiring board F2 is positioned closer to the end PNLE2 than is the origin O.

The IC chips IC1 and IC2 function as a signal source which supplies a signal required to drive the display panel PNL. The IC chips IC1 and IC2 are arranged on the mount MA. The IC chips IC1 and IC2 are aligned in the first direction X. The IC chip IC1 is positioned between the end SUB2e and the flexible wiring board F1. The IC chip IC2 is positioned between the end SUB2e of the flexible wiring board F2.

Figure 2:
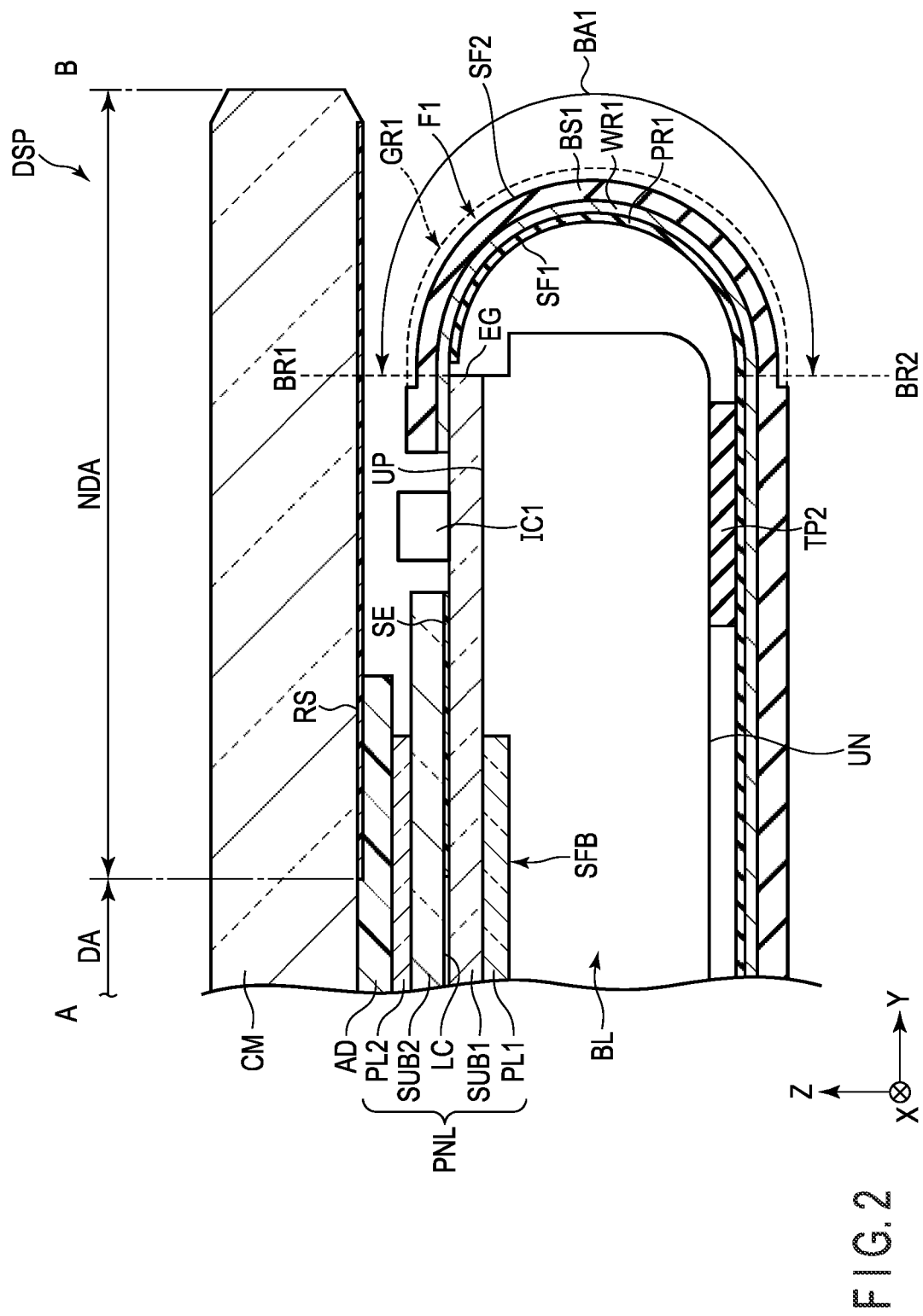
FIG. 2 is a cross-sectional view of the display device, taken along line A-B of FIG. 1.

FIG. 2 is a cross-sectional view of the display device DSP, taken along line A-B of FIG. 1.

The display device DSP includes, in addition to the above structure, a cover member CM and a backlight unit BL. The display panel PNL includes a first substrate SUB1, second substrate SUB2, and liquid crystal layer LC surrounded by a sealant SE. Furthermore, the display panel PNL includes a first polarizer PL1 and a second polarizer PL2. The first polarizer PL1 is adhered to the lower surface of the first substrate SUB1. The second polarizer PL2 is adhered to the upper surface of the second substrate SUB2.

The cover member CM is adhered to the display panel PNL by an adhesive agent AD. The cover member CM is formed of glass or an acrylic transparent resin. The cover member CM includes a light shielding layer RS positioned in a non-display area NDA. The light shielding layer RS is positioned in the lower surface of the cover member CM, contacting the adhesive agent AD. Note that, the light shielding layer RS may be formed on the upper surface of the cover member CM. Although this is not shown, the light shielding layer RS is formed in the peripheral part of the cover member CM in a bezel shape.

The backlight unit BL is arranged to be opposed to the surface SFB of the display panel PNL to illuminate the display panel PNL. The backlight unit BL includes an upper surface UP and a lower surface UN which is opposite to the upper surface UP.

The flexible wiring board F1 is electrically connected and adhered to the display panel PNL by an anisotropy conductive film which is a conductive material. That is, an anisotropy conductive film which is not shown is interposed between the first substrate SUB1 and the mount part of the flexible wiring board F1. While the anisotropy conductive film is interposed between the flexible wiring board F1 and the display panel PNL, the flexible wiring board F1 and the display panel PNL are pressed vertically and heated to connect the flexible wiring board F1 and the display panel PNL in both electrical and physical manners.

The flexible wiring board F1 includes a base member BS1, line WR1, and protection layer PR1 covering the line WR1. The base member BS1 includes a surface (first surface) SF1 and a surface (second surface) SF2 opposite to the surface SF1. The line WR1 is positioned in the surface SF1 side. The base member BS1 and the protection layer PR1 are formed of a synthetic resin such as polyimide, or polyurethane. The line WR1 is formed of, for example, a copper foil. Furthermore, the flexible wiring board F1 is fixed to the lower surface UN of the backlight unit BL by a double-surface tape TP2.

The flexible wiring board F1 includes a bending part BA1 which is bent. The flexible wiring board F1 is bent such that the protection layer PR1 is opposed to the display panel PNL and the backlight unit BL. That is, the protection layer PR1 is positioned in the inner periphery side of the bending part BA1, and the base member BS1 is positioned in the outer peripheral side of the bending part BA1. The flexible wiring board F1 includes, in the bending part BA1, a bending boundary BR1 in the display panel PNL side, and a bending boundary BR2 in the side further apart from the display panel PNL than is the bending boundary BR1. The bending part BA1 corresponds to an area between the bending boundary BR1 and the bending boundary BR2. That is, the flexible wiring board F1 has a curvature between the bending boundary BR1 and the bending boundary BR2.

The base member BS1 includes a groove GR1 positioned in the bending part BA1 and formed in the surface SF2. As shown in the figure, the groove GR1 may be formed to the outside of the bending part BA1. Furthermore, the groove R1 does not pass through the base member BS1. The groove GR1 is formed through, for example, laser treatment.

Figure 3:
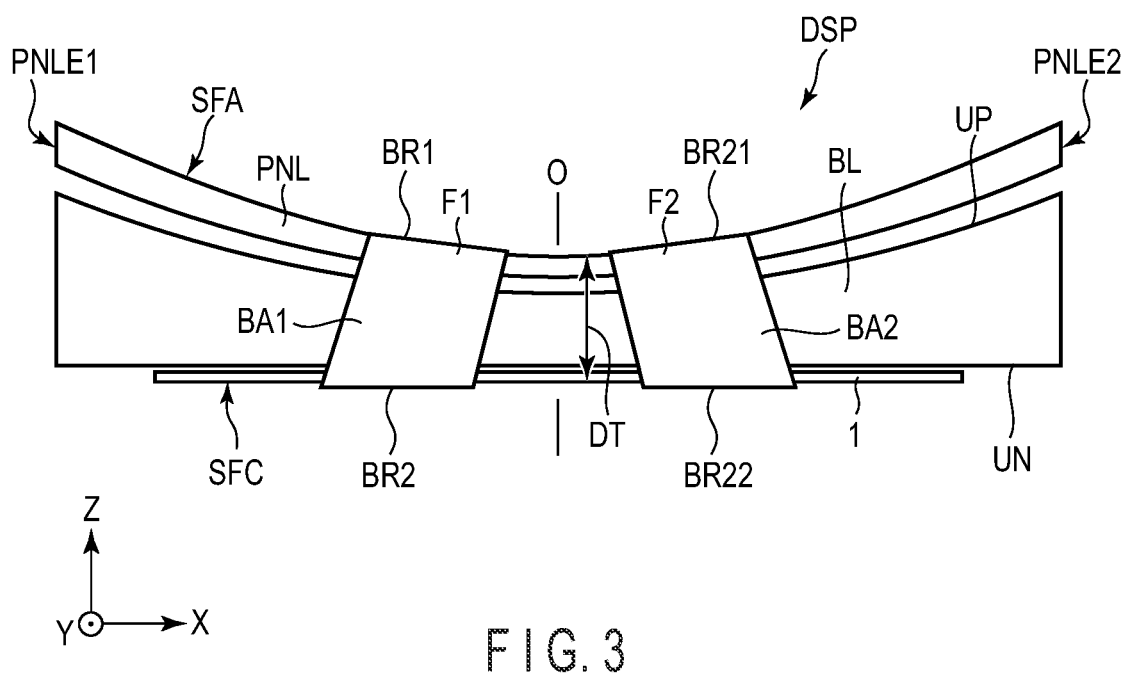
FIG. 3 is a side view of the display device of the embodiment.

FIG. 3 is a side view of the display device DSP of the present embodiment. FIG. 3 is a side view of the display device DSP viewed from the flexible wiring boards F1 and F2 side.

The backlight unit BL is positioned between the display panel PNL and the circuit board 1. The upper surface UP is curved along the surface SFB of the display panel PNL. For example, the upper surface corresponds to the upper surface of the light guide plate of the backlight unit BL, and the light guide plate is curved. The lower surface UN is flat, and corresponds to, for example, the bottom surface of the case accommodating the components of the backlight unit BL.

The flexible wiring board F2 includes a bending part BA2 which is bent. The flexible wiring board F2 includes, in the bending part BA2, a bending boundary BR21 in the display panel PNL side, and a bending boundary BR22 in the side further apart from the display panel PNL than is the bending boundary BR21. The bending part BA2 corresponds to an area between the bending boundary BR21 and the bending boundary BR22. That is, the flexible wiring board F2 has a curvature between the bending boundary BR21 and the bending boundary BR22.

The flexible wiring boards F1 and F2 are mounted on the display surface SFA of the display panel PNL in the one end side, and are mounted on the lower surface SFC of the circuit board 1 in the other end side. Since the display surface SFA is curved, a distance DT between the display surface SFA and the lower surface SFC increases from the origin O to the end PNLE1 side. Similarly, the distance DT increases from the origin O to the end PNLE2 side. Thus, the bending boundaries BR1 and BR2 are inclined to be further apart from each other from the origin O to the end PNLE1 side.

Similarly, the bending boundaries BR21 and BR22 are inclined to be further apart from each other from the origin O to the end PNLE2 side. In other words, the bending part BA1 increases in height from the origin O to the end PNLE1 side, and the bending part BA2 increases in height from the origin O to the end PNLE2 side.

Figure 4:
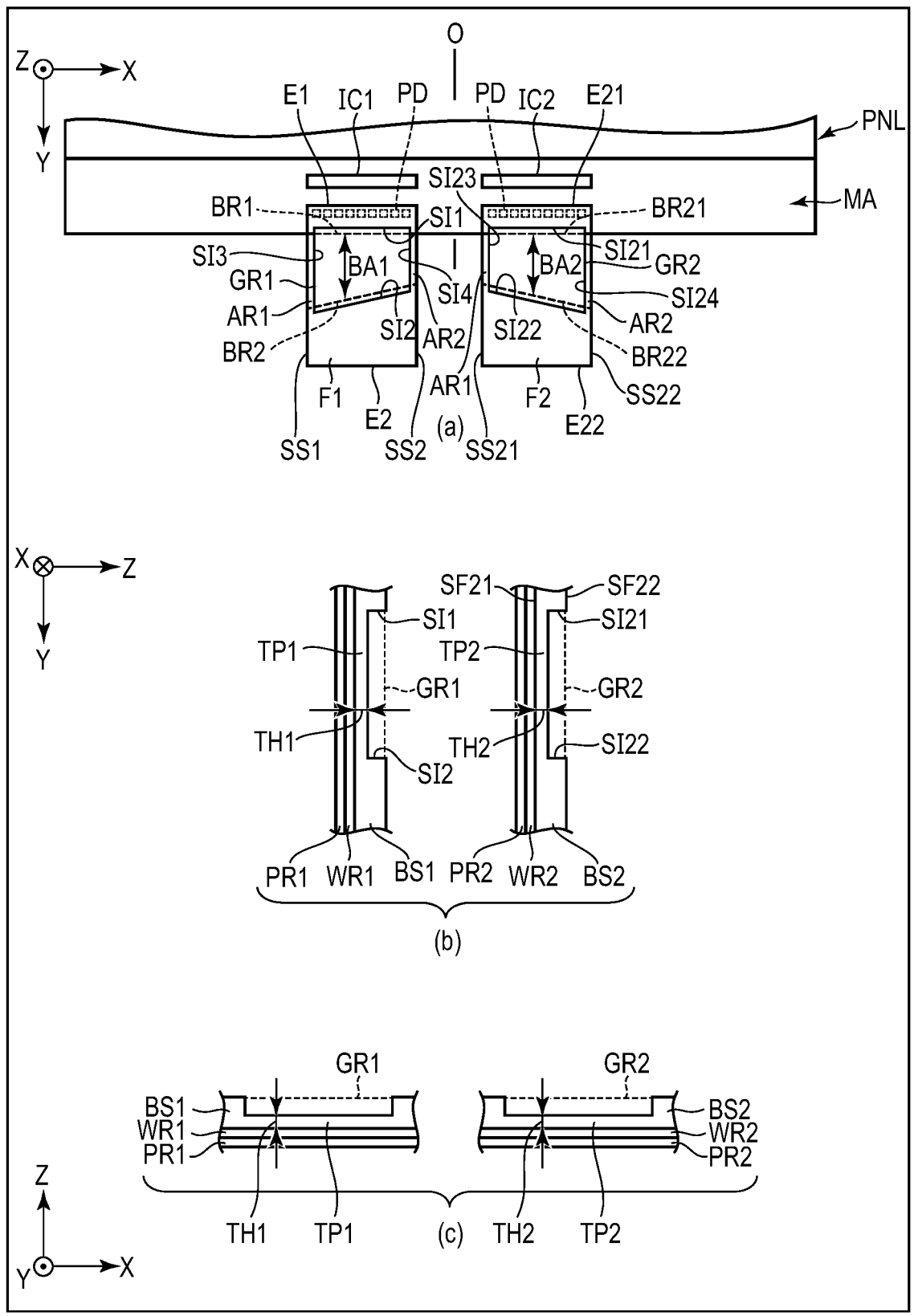
FIG. 4 is a diagram illustrating a flexible wiring board of a first embodiment.

FIG. 4 illustrates flexible wiring boards F1 and F2 of a first embodiment. FIG. 4(a) is an expansion plan view of the flexible wiring boards F1 and F2. FIG. 4(b) is a cross-sectional view of FIG. 4(a), taken along the second direction Y. FIG. 4(c) is a cross-sectional view of FIG. 4(a), taken along the first direction X.

As in FIG. 4(a), the flexible wiring board F1 includes an end (first end) E1 and an end (second end) E2 opposite to the end E1. The flexible wiring board F1 is mounted on the display panel PNL in the end E1 side, overlaps with the pad parts PD, and is mounted on the circuit board 1 in the end E2 side as in FIG. 1. The bending boundary BR1 is positioned in the end E1 side, and the bending boundary BR2 is positioned in the end E2 side. An extension direction of the bending boundary BR2 is inclined with respect to an extension direction of the bending boundary BR1. The flexible wiring board F1 includes a side edge (first side edge) SS1 extending from the end E1 to the end E2, and a side edge (second side edge) SS2 positioned to be opposite to the side edge SS1 and extending from the end E1 to the end E2.

As in FIG. 4(a), the flexible wiring board F2 includes an end E21 and an end E22 opposite to the end E21. The flexible wiring board F2 is mounted on the display panel PNL in the end E21 side, overlaps with the pad parts PD, and is mounted on the circuit board 1 in the end E22 side as in FIG. 1. The bending boundary BR21 is positioned in the end E21 side, and the bending boundary BR22 is positioned in the end E22 side. An extension direction of the bending boundary BR22 is inclined with respect to an extension direction of the bending boundary BR21. The flexible wiring board F2 includes a side edge (first side edge) SS21 extending from the end E21 to the end E22, and a side edge (second side edge) SS22 positioned to be opposite to the side edge SS21 and extending from the end E21 to the end E22.

As in FIG. 4(a), the groove GR1 overlaps with the bending boundaries BR1 and BR2. The groove GR1 includes a side wall SI1 extending along the bending boundary BR1, side wall SI2 extending along the bending boundary BR2, and side walls SI3 and SI4 connecting the side walls SI1 and SI2. An extension direction of the side wall SI2 is inclined with respect to an extension direction of SI1. A width of the side wall SI3 in the second direction Y is greater than a width of the side wall SI4 in the second direction Y. The base member BS1 includes a bezel area AR1 between the side edge SS1 and the groove GR1, and a bezel area SR2 between the side edge SS2 and the groove GR1. The groove GR1 is positioned between the bezel areas AR1 and AR2. That is, the groove GR1 does not extend to the side edges SS1 and SS2. Note that the groove GR1 may extend to the side edges SS1 and SS2.

As in FIG. 4(a), the flexible wiring board F2 includes the groove GR2. The groove GR2 overlaps with the bending boundaries BR21 and BR22, and the groove GR2 includes a side wall SI21 extending along the bending boundary BR21, side wall SI22 extending along the bending boundary BR22, and side walls SI23 and SI24 connecting the side walls SI21 and SI22. An extension direction of the side wall SI22 is inclined with respect to an extension direction of SI21. A width of the side wall SI24 in the second direction Y is greater than a width of the side wall SI23 in the second direction Y. Furthermore, the groove GR2 does not extend to the side edges SS21 and SS22. Note that the groove GR2 may extend to the side edges SS21 and SS22.

As in FIG. 4(b), the flexible wiring board F2 includes a base member BS2, line WR2, and protection layer PR2 covering the line WR2. The base member BS2 includes a surface SF21 and a surface SF22 opposite to the surface SF21. The line WR2 is positioned in the surface SF21 side. The base member BS2 includes a groove GR2 positioned in the bending part BA2 and is formed in the surface SF22.

As in FIG. 4(b), the base member BS1 includes a thin film part TP1 in a position overlapping with the groove GR1. The thin film part TP1 has a thickness TH1. The thickness TH1 is substantially constant in the second direction Y. The base member BS2 includes a thin film part TP2 in a position overlapping with the groove GR2. The thin film part TP2 has a thickness TH2. The thickness TH2 is substantially constant in the second direction Y. As in FIG. 4(c), the thickness TH1 is substantially constant in the first direction X. The thickness TH2 is substantially constant in the first direction X.

According to the present embodiment, the flexible wiring board F1 includes the groove GR1 formed in the base member BS1. Thus, the thin film part TP1 can be formed in the flexible wiring board F1, and the rigidity of the flexible wiring board F1 can be decreased. Thus, the flexible wiring board F1 can easily be bent, and a repulsive force produced by bending can be decreased. Thus, peeling of a joint part of the backlight unit BL and the display panel PNL, peeling of double-sided tape TP2, and peeling and deformation of internal components of the backlight unknit BL which may be caused by the repulsive force of the flexible wiring board F1 can be suppressed. Furthermore, even in the display device DSP which does not require a backlight unit BL, peeling of the flexible wiring board F1, and peeling and deformation of a member to which the flexible wiring board F1 is attached can be suppressed. Furthermore, components conventionally used to adhere the flexible wiring board F1 against the repulsive force can be reduced, and thus, production costs can be reduced, and the assembly line can be reduced.

Furthermore, by decreasing the repulsive force with respect to the bending of the flexible wiring board F1, the flexible wiring board F1 can be bent in a further steep manner, and external expansion of the flexible wiring board F1 can be decreased. Thus, a narrower bezel can be achieved in the display device DSP.

Furthermore, in the example depicted, the groove GR1 is arranged in a position overlapping with the bending boundaries BR1 and BR2. In the bending boundaries BR1 and BR2, greater shearing stress tends to occur because of the bending stress. However, with the groove GR1, the thickness of the flexible wiring board F1 in the bending boundaries BR1 and BR2 is decreased, and thus, the shearing stress can be relaxed. Even in the parts where the stress is especially great, cut and short-circuit of the flexible wiring board F1 and the line WR1 can be suppressed.

Furthermore, in the present embodiment, the base member BS1 includes the bezel areas AR1 and AR2, and the groove GR1 is not formed to the side edges SS1 and SS2. Thus, the side edges SS1 and SS2 are not thinned, and cutting of the flexible wiring board F1 from the side edges SS1 and SS2 can be suppressed.

Note that, in this example, only the flexible wiring board F1 is explained, however, the same applies to the flexible wiring board F2. Furthermore, the number of flexible wiring boards mounted on the display panel PNL is not limited to two, and may be one, or may be three or more.

Figure 5:
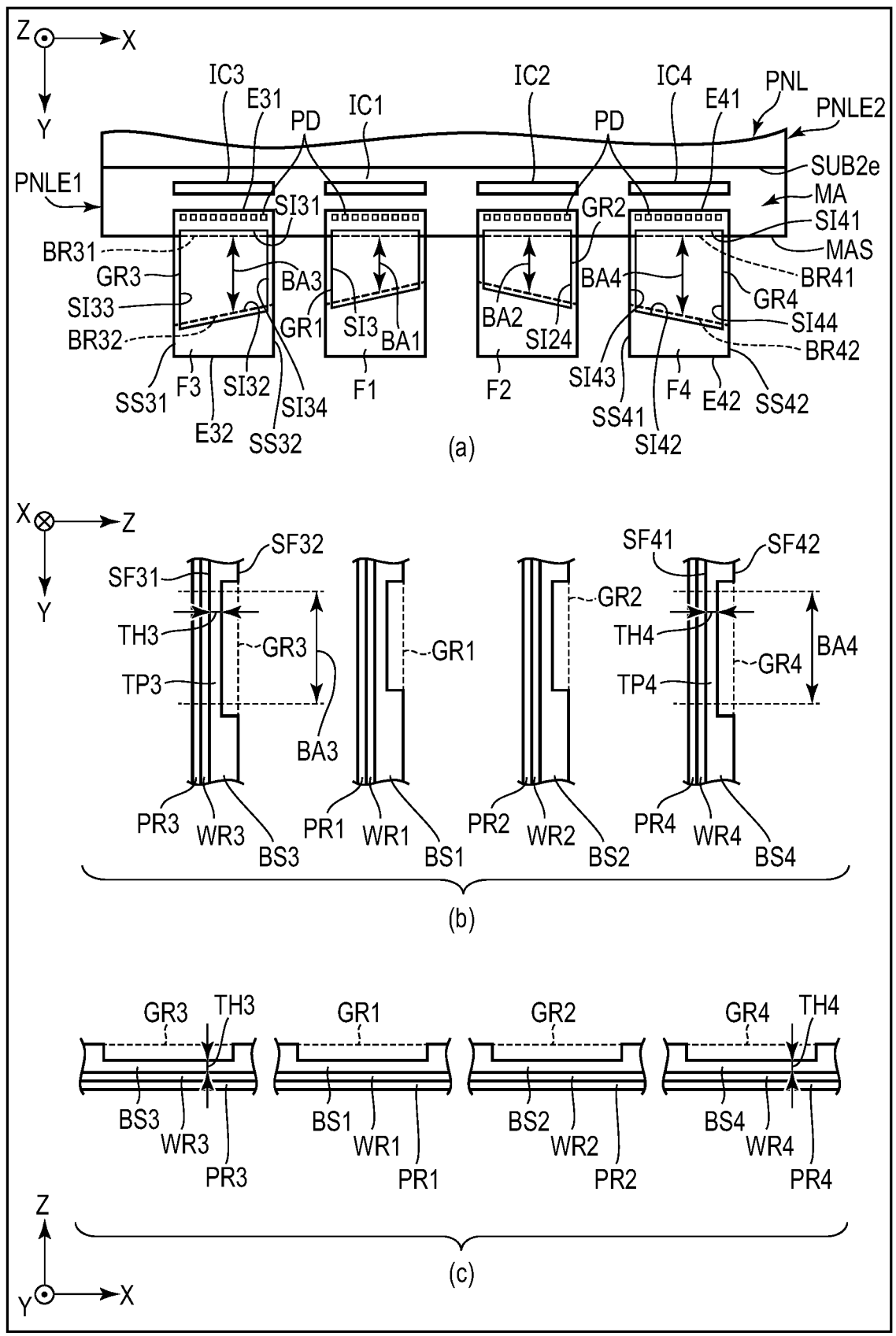
FIG. 5 is a diagram illustrating a flexible wiring board of a first variant of the first embodiment.

FIG. 5 illustrates flexible wiring boards F1 to F4 of a first variant of the first embodiment. FIG. 5(a) is an expanded plan view of the flexible wiring boards F1 to F4. FIG. 5(b) is a cross-sectional view of FIG. 5(a) in the second direction Y. FIG. 5(c) is a cross-sectional view of FIG. 5(a) in the first direction X. In the structure of FIG. 5, as compared to the structure of FIG. 4, four flexible wiring boards F1 to F4 are mounted on the display panel PNL. The flexible wiring boards F3 and F4 include the structure substantially the same as that of the flexible wiring board F1.

IC chips IC3 and IC4 are arranged on the mount MA. The IC chip IC3 is positioned between the end SUB2e and the flexible wiring board F3. The IC chip IC4 is positioned between the end SUB2e and the flexible wiring board F4. The flexible wiring board F3 is positioned closer to the end PNLE1 side than is the flexible wiring board F1. The flexible wiring board F4 is positioned closer to the end PNLE2 side than is the flexible wiring board F2.

As in FIG. 5(a), the flexible wiring board F3 includes ends E31 and E32, bending boundary BR31 positioned in the end E31 side, bending boundary BR32 positioned in the end E32 side, bending part BA3 between the bending boundaries BR31 and BR32, and side edges SS31 and SS32 extending from the end E31 to the end E32. An extension direction of the bending boundary BR32 is inclined with respect to an extension direction of the bending boundary BR31. The flexible wiring board F3 includes a groove GR3 overlapping with the bending boundaries BR31 and BR32. The groove GR3 includes a side wall SI31 extending along the bending boundary BR31, side wall SI32 extending along the bending boundary BR32, and side walls SI33 and SI34 connecting the side walls SI31 and SI32. An extension direction of the side wall SI32 is inclined with respect to an extension direction of the side wall SI31. A width of the side wall SI33 in the second direction Y is greater than a width of the side wall SI34 in the second direction Y. Furthermore, the groove GR3 does not extend to the side edges SS31 and SS32. Note that, the groove GR3 may extend to the side edges SS31 and SS32.

As in FIG. 5(a), the flexible wiring board F4 includes ends E41 and E42, bending boundary BR41 positioned in the end E41 side, bending boundary BR42 positioned in the end E42 side, bending part BA4 between the bending boundaries BR41 and BR42, and side edges SS41 and SS42 extending from the end E41 to the end E42. An extension direction of the bending boundary BR42 is inclined with respect to an extension direction of the bending boundary BR41. The flexible wiring board F4 includes a groove GR4 overlapping with the bending boundaries BR41 and BR42. The groove GR4 includes a side wall SI41 extending along the bending boundary BR41, side wall SI42 extending along the bending boundary BR42, and side walls SI43 and SI44 connecting the side walls SI41 and SI42. An extension direction of the side wall SI42 is inclined with respect to an extension direction of the side wall SI41. A width of the side wall SI44 in the second direction Y is greater than a width of the side wall SI43 in the second direction Y. Furthermore, the groove GR4 does not extend to the side edges SS41 and SS42. Note that, the groove GR4 may extend to the side edges SS41 and SS42. The flexible wiring boards F3 and F4 are mounted on the display panel PNL in the ends E31 and E41 side, overlap with the pad parts PD, and mounted on the circuit board in the ends E32 and E42 side.

As in FIG. 3, since the display surface SFA is curved, the distance DT between the display surface SFA and the lower surface SFC becomes greater from the origin O to the end PNLE1 side, and from the origin O to the end PNLE2 side. Thus, a width of the bending part BA3 in the second direction Y is greater than a width of the bending part BA1 in the second direction Y. Furthermore, a width of the bending part BA4 in the second direction Y is greater than a width of the bending part BA2 in the second direction Y. Specifically, a width of the side wall SI34 in the second direction Y is greater than a width of the side wall SI33.

Furthermore, a width of the side wall SI43 in the second direction Y is greater than a width of the side wall SI24 in the second direction Y.

As in FIG. 5(b), the flexible wiring board F3 includes a base member BS3 including surfaces SF31 and SF32, line WR3, and protection layer PR3 covering the line WR3. The line WR3 is positioned in the surface SF31 side. The base member BS3 includes a groove GR3 positioned in the bending part BA3 and formed in the surface SF32. The base member BS3 includes a thin film part TP3 in a position overlapping with the groove GR3. The thin film part TP3 includes a thickness TH3. The thickness TH3 is substantially constant in the second direction Y.

As in FIG. 5(b), the flexible wiring board F4 includes a base member BS4 including surfaces SF41 and SF42, line WR4, and protection layer PR4 covering the line WR4. The line WR4 is positioned in the surface SF41 side. The base member BS4 includes a groove GR4 positioned in the bending part BA4 and formed in the surface SF42. The base member BS4 includes a thin film part TP4 in a position overlapping with the groove GR4. The thin film part TP4 has a thickness TH4. The thickness TH4 is substantially constant in the second direction Y.

As in FIG. 5(c), the thickness TH3 is substantially constant in the first direction X. The thickness TH4 is substantially constant in the first direction X.

The first variant of the first embodiment can achieve the aforementioned advantages of the first embodiment.

Figure 6:
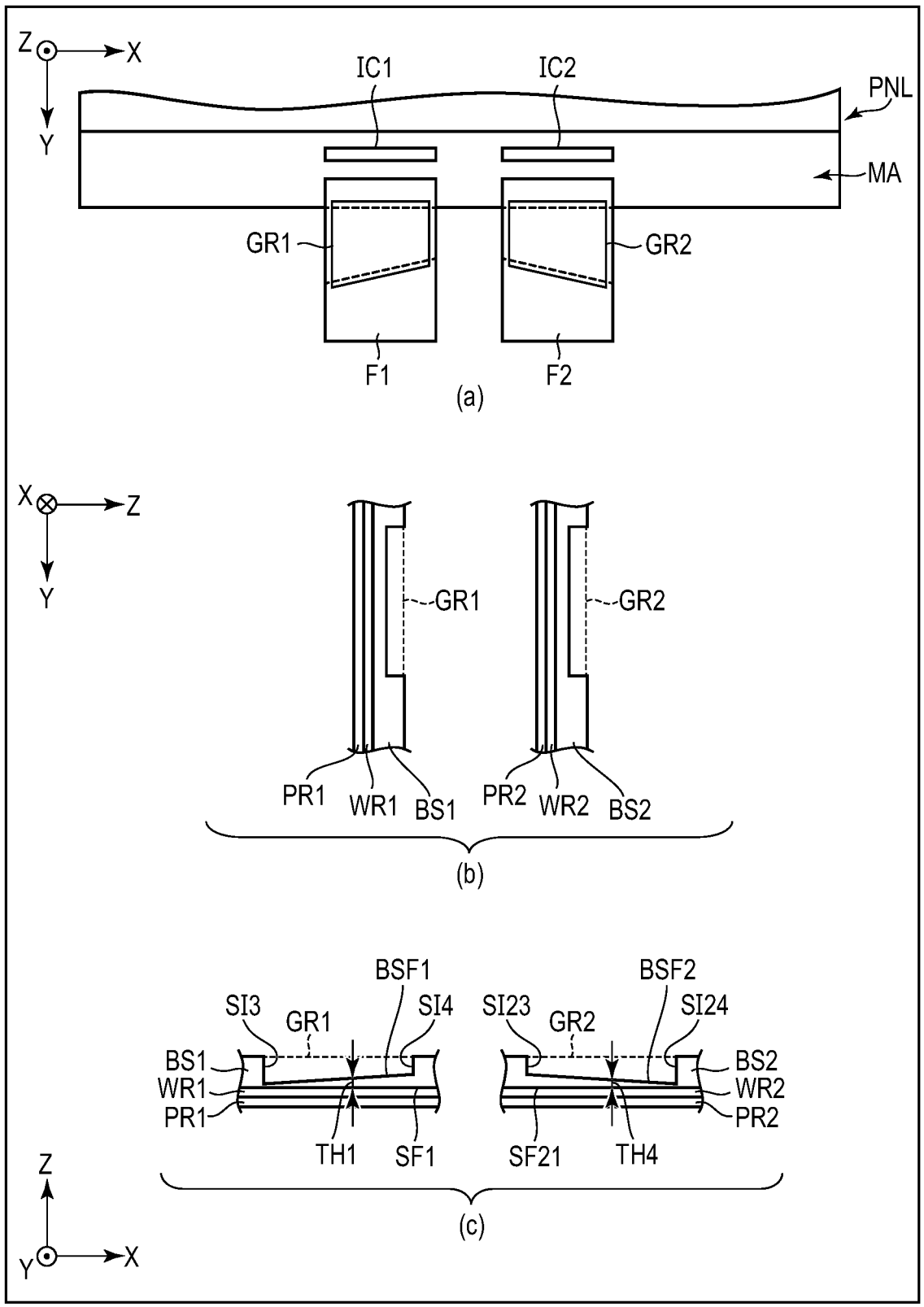
FIG. 6 is a diagram illustrating a flexible wiring board of a second variant of the first embodiment.

FIG. 6 illustrates flexible wiring boards F1 and F2 of a second variant of the first embodiment. FIG. 6(a) is an expanded plan view of the flexible wiring boards F1 and F2. FIG. 6(b) is a cross-sectional view of FIG. 6(a) in the second direction Y. FIG. 6(c) is a cross-sectional view of FIG. 6(a) in the first direction X. In the structure of FIG. 6, as compared to the structure of FIG. 4, the grooves GR1 and GR2 include inclined bottom surfaces BSF1 and BSF2. The structures of (a) and (b) of FIG. 6 are equal to those of (a) and (b) of FIG. 4.

As in FIG. 6(c), the groove GR2 includes a bottom surface BSF1 inclined with respect to the surface SF1. That is, the thickness TH1 gradually decreases from the side wall SI4 to the side wall SI3. Furthermore, the groove GR2 includes a bottom surface BSF2 inclined with respect to the surface SF21. That is, the thickness TH2 gradually decreases from the side wall SI23 to the side wall SI24. Since the repulsive force of the bending parts BA1 and BA2 increases to the outer side, the film becoming thinner to the outer side facilitates the bending of the flexible wiring boards F1 and F2.

The second variant of the first embodiment can achieve the aforementioned advantages of the first embodiment.

Figure 7:
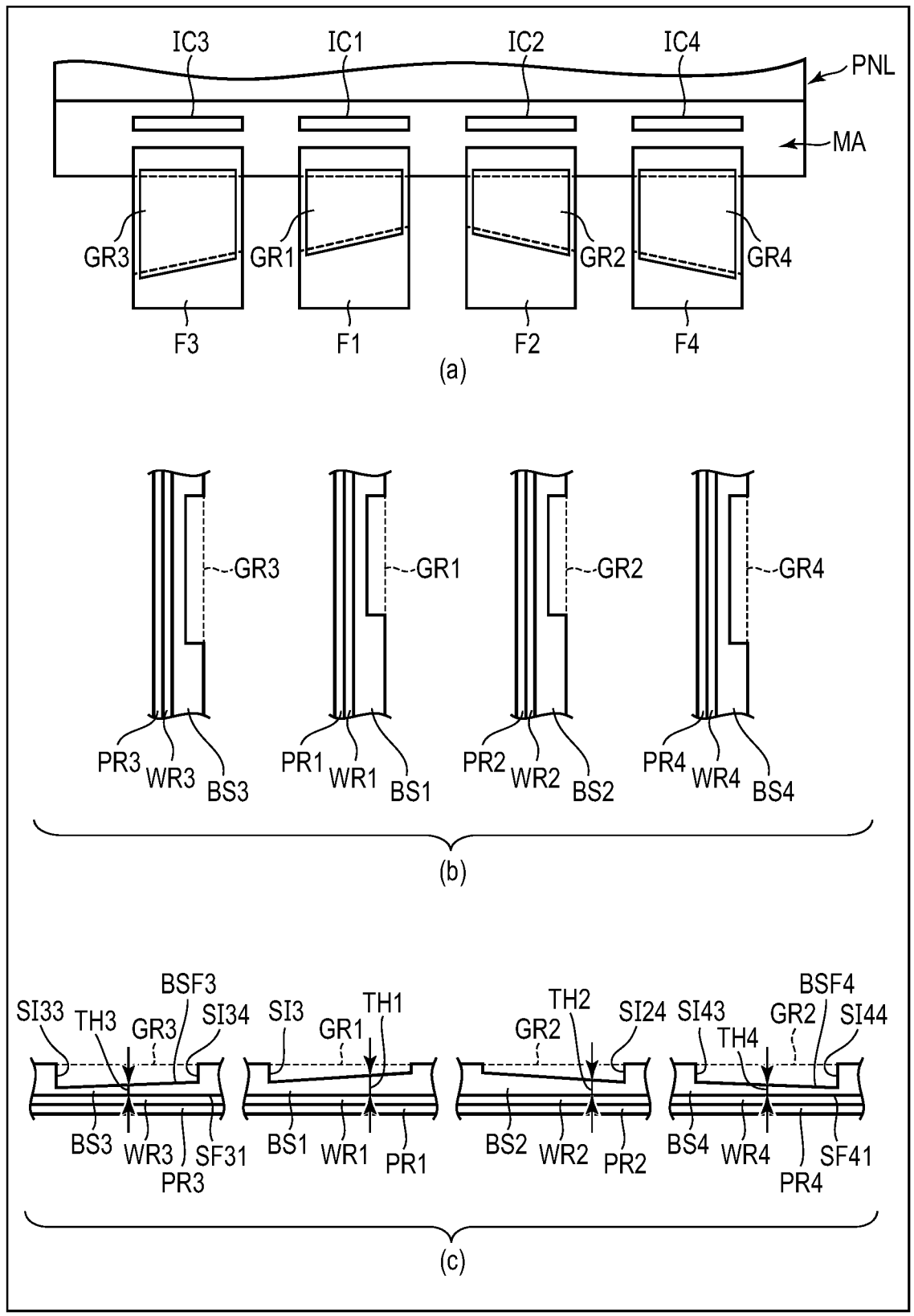
FIG. 7 is a diagram illustrating a flexible wiring board of a third variant of the first embodiment.

FIG. 7 illustrates flexible wiring boards F1 to F4 of a third variant of the first embodiment. FIG. 7(a) is an expanded plan view of the flexible wiring boards F1 to F4. FIG. 7(b) is a cross-sectional view of FIG. 7(a) in the second direction Y. FIG. 7(c) is a cross-sectional view of FIG. 7(a) in the first direction X. In the structure of FIG. 7, as compared to the structure of FIG. 6, four flexible wiring boards F1 to F4 are mounted on the display panel PNL. The structures of (a) and (b) of FIG. 7 are equal to those of (a) and (b) of FIG. 5.

As in FIG. 7(c), the groove G32 includes a bottom surface BSF3 inclined with respect to the surface SF31. That is, the thickness TH3 gradually decreases from the side wall SI34 to the side wall SI33. Furthermore, the groove GR4 includes a bottom surface BSF4 inclined with respect to the surface SF41. That is, the thickness TH4 gradually decreases from the side wall SI43 to the side wall SI44. Since the repulsive force of the bending parts BA3 and BA4 increases to the outer side, the film becoming thinner to the outer side facilitates the bending of the flexible wiring boards F3 and F4. The thickness TH3 is less than the thickness TH1. Furthermore, the thickness TH4 is less than the thickness TH2. Specifically, the thickness TH3 in a position overlapping the side wall SI34 is less than the thickness TH1 in a position overlapping the side wall SI3. The thickness TH4 in a position overlapping the side wall SI43 is less than the thickness TH2 in a position overlapping the side wall SI24.

The third variant of the first embodiment can achieve the aforementioned advantages of the first embodiment.

Now, a second embodiment will be explained with reference to FIGS. 8 and 9.

FIG. 8 is a cross-sectional view of a flexible wiring board F1 of a second embodiment. The structure of FIG. 8 includes, as compared to the structure of FIG. 2, the groove GR1 including a first part PT1 overlapping with the bending boundary BR1 and a second part PT2 overlapping the bending boundary BR2.

The first part PT1 is positioned immediately above the end EG of the first substrate SUB1. Note that, as in the figure, the first part PT1 and the second part PT2 may be formed to the outside of the bending part BA1. Furthermore, the flexible wiring board F1 is explained in this example, but the same applies to the flexible wiring board F2.

Figure 9:
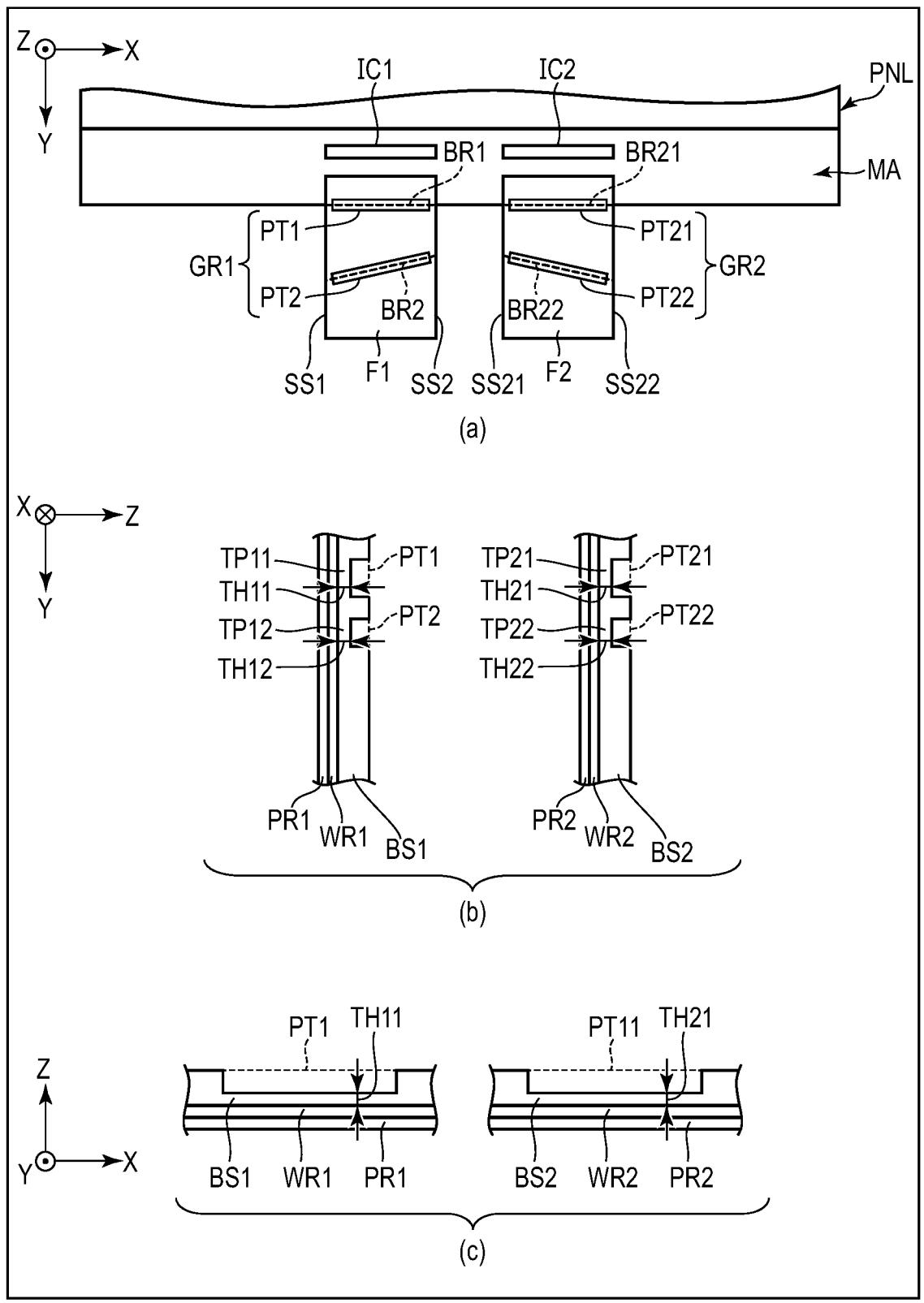
FIG. 9 is a diagram illustrating the flexible wiring board of the second embodiment.

FIG. 9 illustrates flexible wiring boards F1 and F2 of the second embodiment. FIG. 9(a) is an expanded plan view of the flexible wiring boards F1 and F2. FIG. 9(b) is a cross-sectional view of FIG. 9(a) in the second direction Y. FIG. 9(c) is a cross-sectional view of FIG. 9(a) in the first direction X. In the structure of FIG. 9, as compared to the structure of FIG. 4, the grooves GR1 and GR2 are shaped differently.

As in FIG. 9(a), the groove GR1 includes a first part PT1 extending to overlap with the bending boundary BR1 and a second part PT2 extending to overlap with the bending boundary BR2. The groove GR2 includes a first part PT21 extending to overlap with the bending boundary BR21 and a second part PT22 extending to overlap with the bending boundary BR22. The first part PT1 and the second part PT2 do not extend to side edges SS1 and SS2. Furthermore, the first part PT21 and the second part PT22 do not extend to side edges SS21 and SS22. Note that, the first part PT1 and the second part PT2 may extend to the side edges SS1 and SS2. Furthermore, the first part PT21 and the second part PT22 may extend to the side edges SS21 and SS22.

As in FIG. 9(b), the base member BS1 includes a thin film part TP11 in a position overlapping with the first part PT1 and a thin film part TP12 in a position overlapping with the second part PT2. The thin film part TP11 has a thickness TH11, and the thin film part TP12 has a thickness TH12. The thicknesses TH11 and TH12 may be different from each other. The base member BS2 includes a thin film part TP21 in a position overlapping with the first part PT21 and a thin film part TP22 in a position overlapping with the second part PT22. The thin film part TP21 has a thickness TH21, and the thin film part TP22 has a thickness Th22. The thicknesses TH21 and TH22 may be different from each other.

As in FIG. 9(c), the thickness TH11 is substantially constant in the first direction X. The thickness TH21 is substantially constant in the first direction X. Note that, although this is not shown, the thicknesses TH12 and TH22 are substantially constant in the extension direction of the second parts PT2 and PT22. Furthermore, as in FIG. 6(c), the thicknesses TH11, TH12, TH21, and TH22 may be tapered toward the outer side.

The second embodiment as above can achieve the aforementioned advantages of the first embodiment.

Now, a third embodiment will be explained with reference to FIG. 10.

Figure 10:
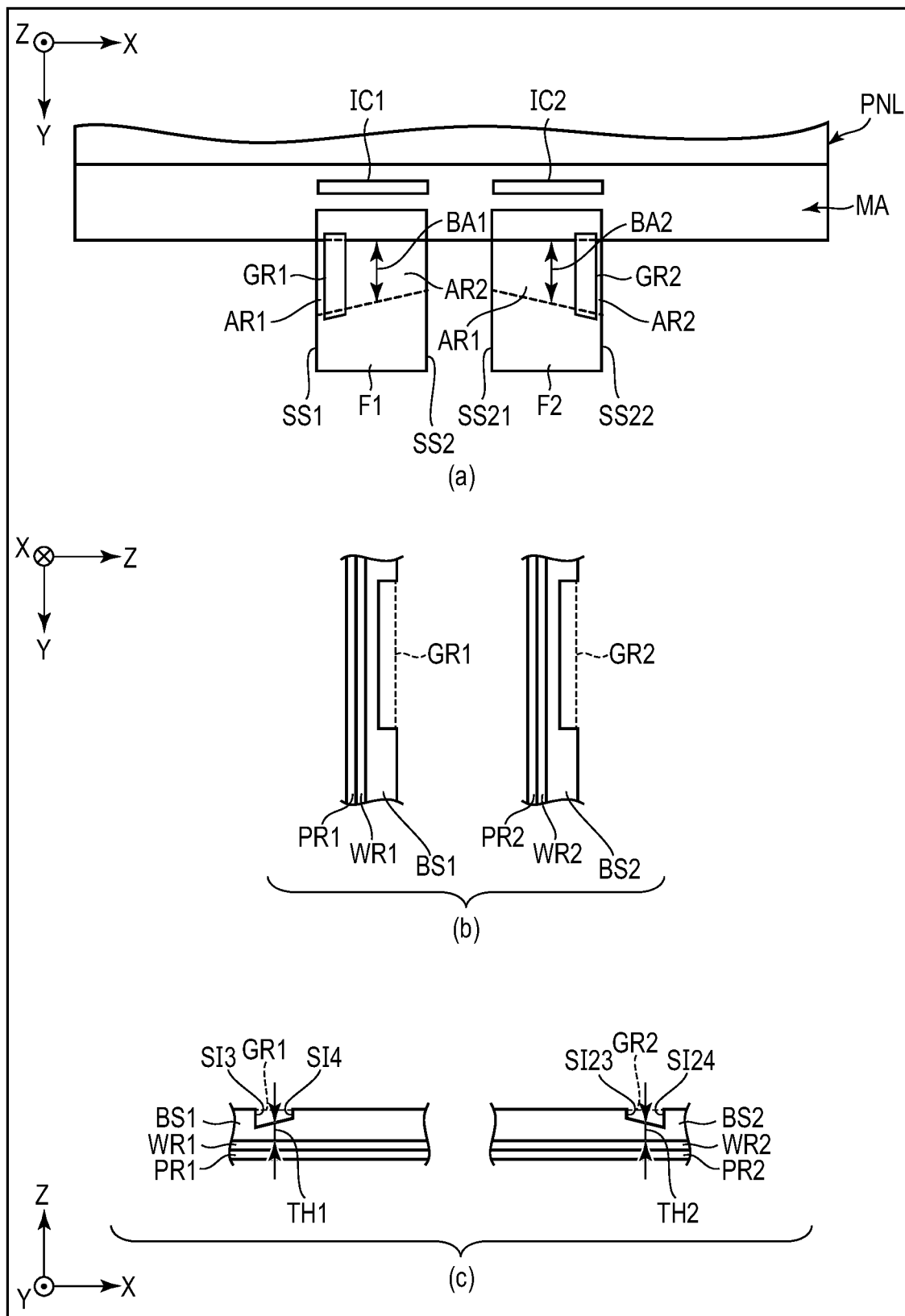
FIG. 10 is a diagram illustrating a flexible wiring board of a third embodiment.

FIG. 10 illustrates flexible wiring boards F1 and F2 of the third embodiment. FIG. 10(a) is an expanded plan view of the flexible wiring boards F1 and F2. FIG. 10(b) is a cross-sectional view of FIG. 10(a) in the second direction Y. FIG. 10(c) is a cross-sectional view of FIG. 10(a) in the first direction X. In the structure of FIG. 10, as compared to the structure of FIG. 4, the grooves GR1 and GR2 are shaped differently.

As in FIG. 10(a), the groove GR1 is positioned closer to the side edge SS1 as compared to the side edge SS2. That is, in the flexible wiring board F1, a width of the bezel area AR2 in the first direction X is greater than a width of the bezel area AR1 in the first direction X. The groove GR2 is positioned closer to the side edge SS22 as compared to the side edge SS21. That is, in the flexible wiring board F2, a width of the bezel area AR1 in the first direction X is greater than a width of the bezel area AR2 in the first direction. The groove GR1 does not extend to the side edge SS1; however, it may extend to the side edge SS1. The groove GR2 does not extend to the side edge SS22; however, it may extend to the side edge SS22. FIG. 10(b) is similar to FIG. 4(b).

As in FIG. 10(c), the thickness TH1 is tapered from the side wall SI4 to the side wall SI3. The thickness TH2 is tapered from the side wall SI23 to the side wall SI24. Note that, the thicknesses TH1 and TH2 may be constant in the first direction X. Since the repulsive force increases toward the outer side in the bending parts BA1 and BA2, the outer side may be thinned as in the above structure.

The third embodiment as above can achieve the aforementioned advantages of the first embodiment.

Figure 11:
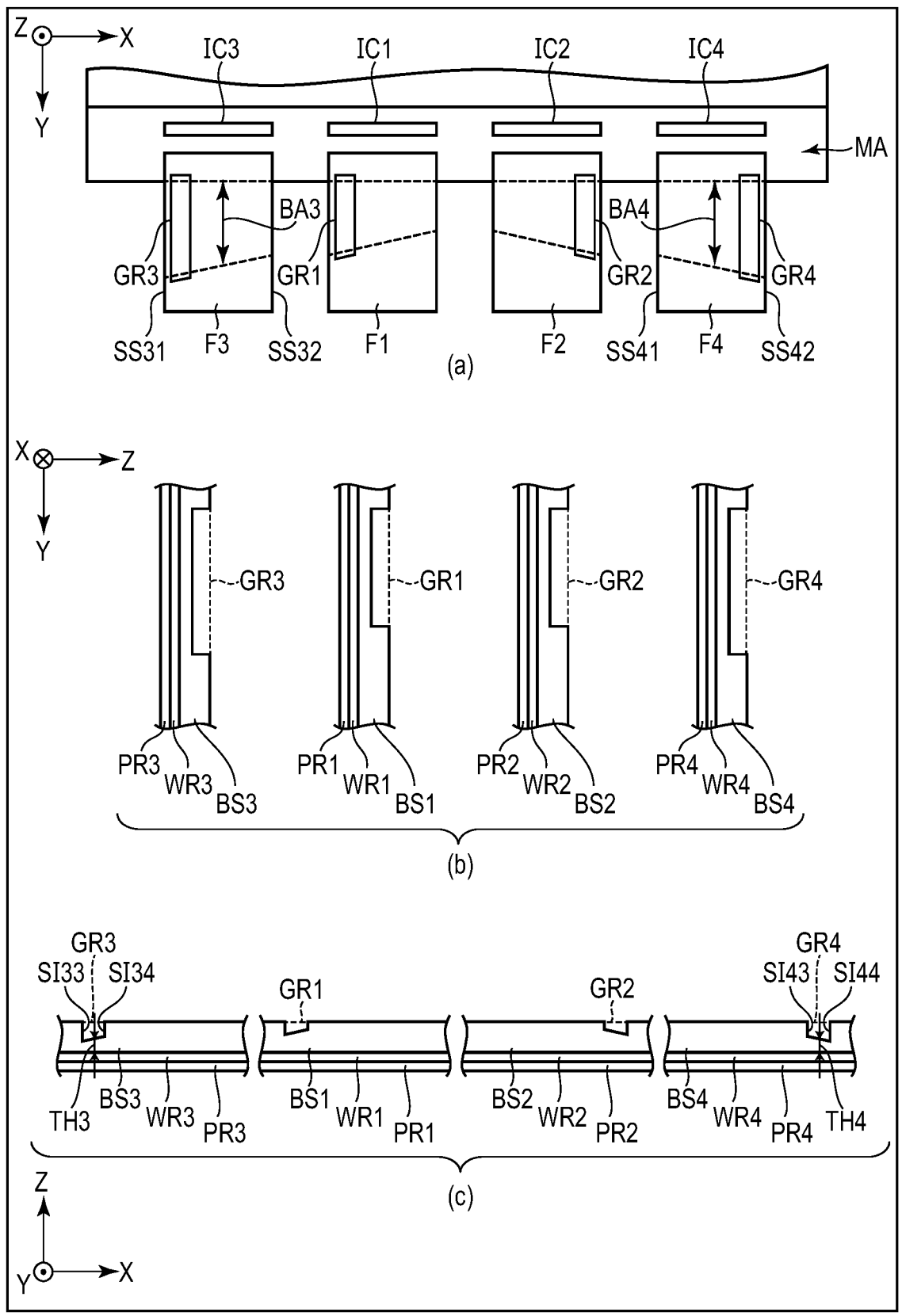
FIG. 11 is a diagram illustrating a flexible wiring board of a first variant of the third embodiment.

FIG. 11 illustrates flexible wiring boards F1 to F4 of a first variant of the third embodiment. FIG. 11(a) is an expanded plan view of the flexible wiring boards F1 to F4. FIG. 11(b) is a cross-sectional view of FIG. 11(a) in the second direction Y. FIG. 11(c) is a cross-sectional view of FIG. 11(a) in the first direction X. In the structure of FIG. 11, as compared to the structure of FIG. 10, four flexible wiring boards F1 to F4 are mounted on the display panel PNL.

As in FIG. 11(a), the groove GR3 is positioned closer to the side edge SS31 as compared to the side edge SS32. The groove GR4 is positioned closer to the side edge SS42 as compared to the side edge SS41. The groove GR3 does not extend to the side edge SS31; however, it may extend to the side edge SS31. The groove GR4 does not extend to the side edge SS42; however, it may extend to the side edge SS42. FIG. 11(b) is similar to FIG. 5(b).

As in FIG. 11(c), the thickness TH3 is tapered from the side wall SI34 to the side wall SI33. The thickness TH4 is tapered from the side wall SI43 to the side wall SI44. Note that, the thicknesses TH3 and TH4 may be constant in the first direction X. Since the repulsive force increases toward the outer side in the bending parts BA3 and BA4, the outer side may be thinned as in the above structure.

The first variant of the third embodiment as above can achieve the aforementioned advantages of the first embodiment.

Now, a fourth embodiment will be explained with reference to FIG. 12.

Figure 12:
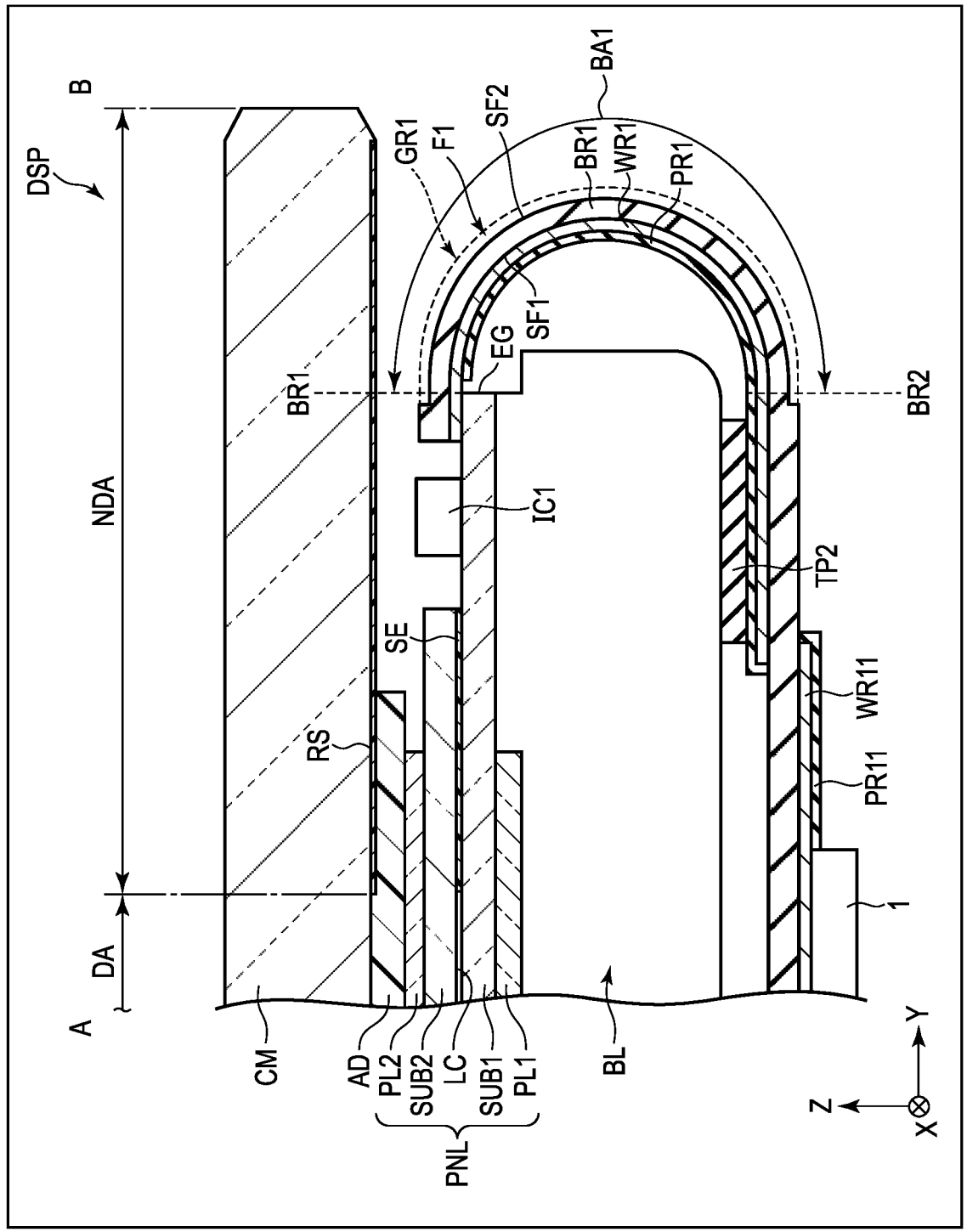
FIG. 12 is a cross-sectional view of a flexible wiring board of a fourth embodiment.

FIG. 12 is a cross-sectional view of a flexible wiring board F1 of a fourth embodiment. The structure of FIG. 12 includes, as compared to the structure of FIG. 2, the flexible wiring board F1 includes a line WR11 in the surface SF2.

The flexible wiring board F1 includes a line WR11 positioned in the surface SF2, and a protection layer PR11 covering the line WR11. The line WR11 is connected to the line WR1 through a through hole formed in the base member BS1, which is not shown. Furthermore, the circuit board 1 is arranged in the surface SF2 side and is connected to the line WR11.

The fourth embodiment as above can achieve the aforementioned advantages of the first embodiment.

Now, a fifth embodiment will be explained with reference to FIG. 13.

Figure 13:
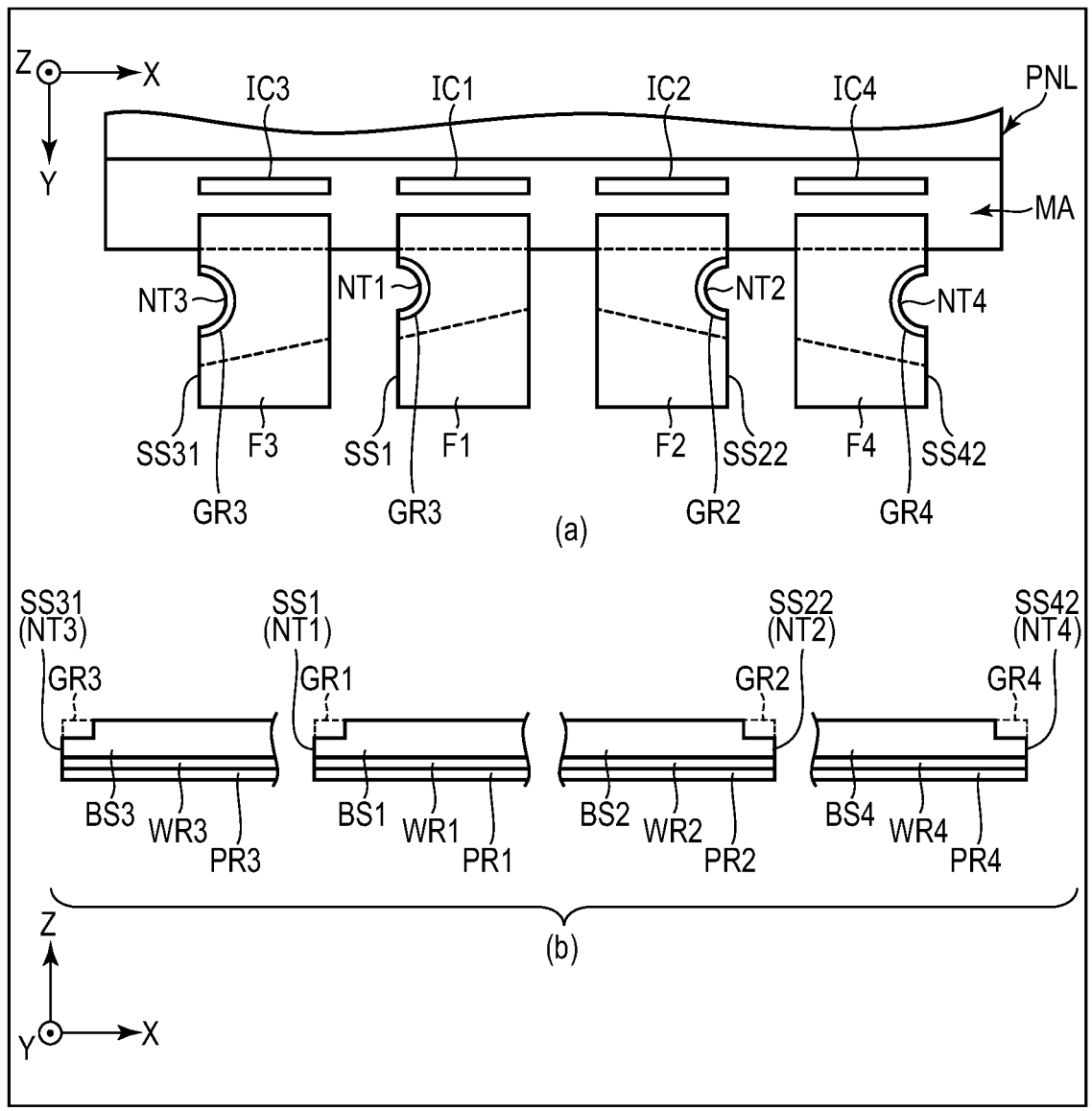
FIG. 13 is a diagram illustrating a flexible wiring board of a fifth embodiment.

FIG. 13 illustrates flexible wiring boards F1 and F2 of a fifth embodiment. FIG. 13(a) is an expanded plan view of flexible wiring boards F1 to F4. FIG. 13(b) is a cross-sectional view of FIG. 13(a) in the first direction X. The structure of FIG. 13 includes, as compared to the structure of FIG. 5, the flexible wiring boards F1 to F4 including notched parts NT1 to NT4, respectively.

As in FIG. 13(a), the flexible wiring board F1 includes a notched part NT1 formed in the side edge SS1. The groove GR1 is arranged along the outer shape of the notched part NT1. The flexible wiring board F2 includes a notched part NT2 formed in the side edge SS22. The groove GR2 is arranged along the outer shape of the notched part NT2. The flexible wiring board F3 includes a notched part NT3 formed in the side edge SS31. The groove GR3 is arranged along the outer shape of the notched part NT3. The flexible wiring board F4 includes a notched part NT4 formed in the side edge SS42. The groove GR4 is arranged along the outer shape of the notched part NT4. With the notched parts NT1 to NT4, the flexible wiring boards F1 to F4 are easily bent.

As in FIG. 13(b), the groove GR1 extends to the side edge SS1 in the inner periphery of the notched part NT1. The grove GR2 extends to the side edge SS22 in the inner periphery of the notched part NT2. The groove GR3 extends to the side edge SS31 in the inner periphery of the notched part NT3. The groove GR4 extends to the side edge SS42 in the inner periphery of the notched part NT4.

The fifth embodiment as above can achieve the aforementioned advantages of the first embodiment.

Now, a sixth embodiment will be explained with reference to FIG. 14.

Figure 14:
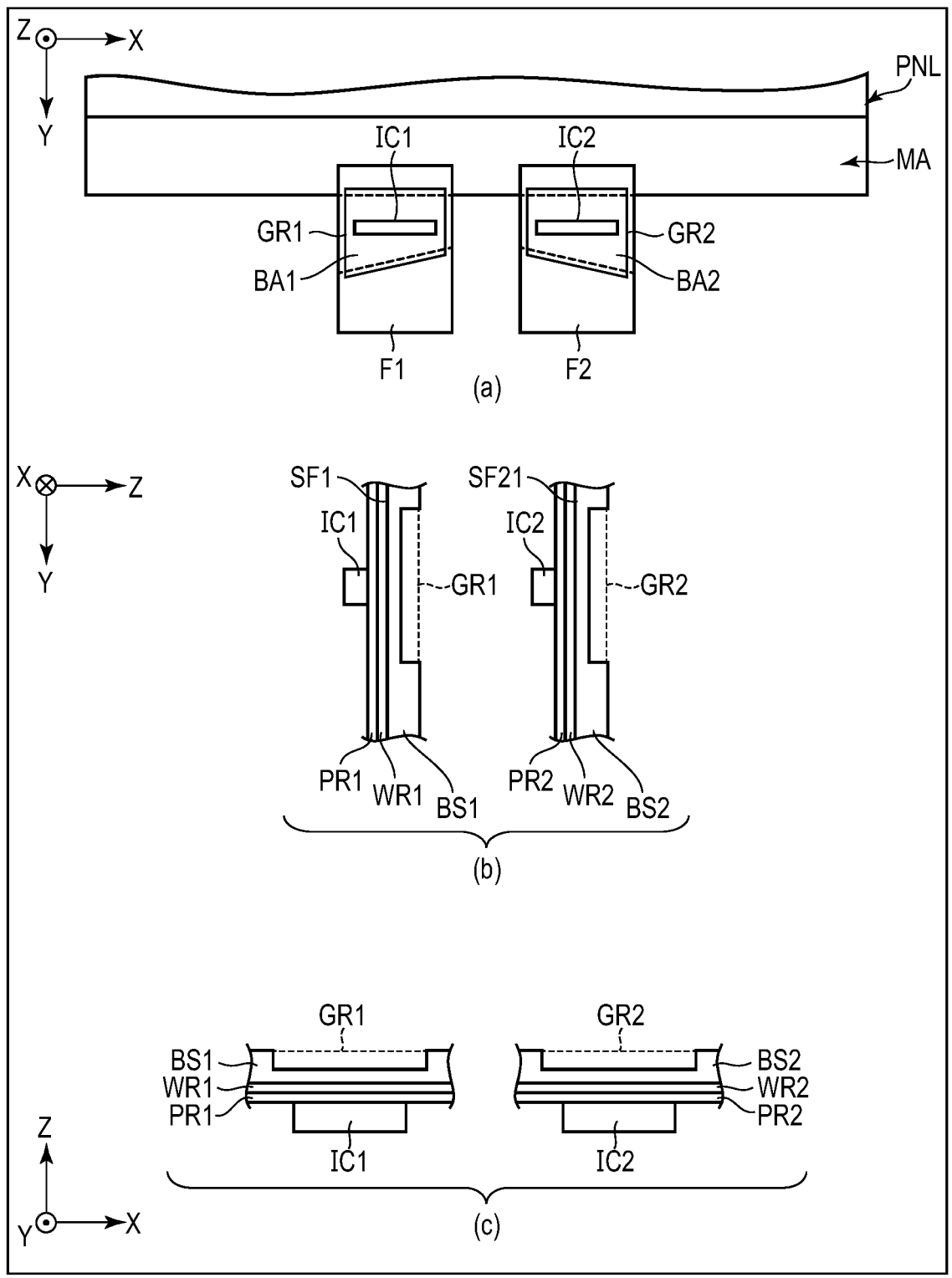
FIG. 14 is a diagram illustrating a flexible wiring board of a sixth embodiment.

FIG. 14 illustrates flexible wiring boards F1 and F2 of a sixth embodiment. FIG. 14(a) is an expanded plan view of flexible wiring boards F1 and F2. FIG. 14(b) is a cross-sectional view of FIG. 14(a) in the second direction Y. FIG. 14(c) is a cross-sectional view of FIG. 14(a) in the first direction X. The structure of FIG. 14 includes, as compared to the structure of FIG. 4, IC chips IC1 and IC2 are mounted on the flexible wiring boards F1 and F2, respectively.

As in FIG. 14(a), the IC chip IC1 overlaps with the bending part BA1. The groove GR1 overlaps with the IC chip IC1. The IC chip IC2 overlaps with the bending part BA2. The groove GR2 overlaps with the IC chip IC2.

As in (b) and (c) of FIG. 14, the IC chip IC1 is mounted on the surface SF1 side and electrically connected to the line WR1 through a through hole or a connection pad in the protection layer PR1, which is not shown. The IC chip IC2 is mounted on the surface SF21 side and electrically connected to the line WR2 through a through hole or a connection pad in the protection layer PR2, which is not shown.

The sixth embodiment as above can achieve the aforementioned advantages of the first embodiment.

Figure 15:
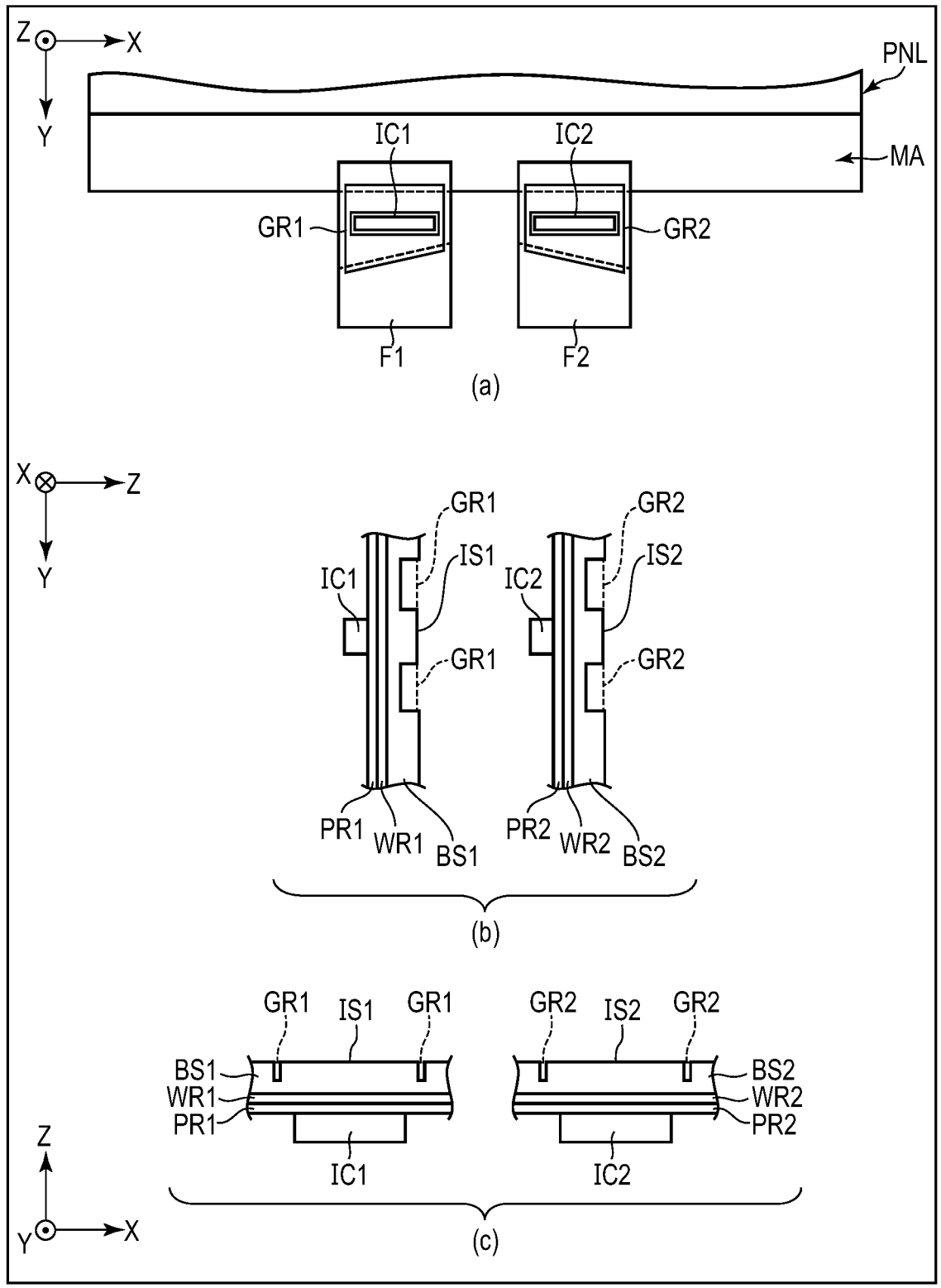
FIG. 15 is a diagram illustrating a flexible wiring board of a first variant of the sixth embodiment.

FIG. 15 illustrates flexible wiring boards F1 and F2 of a first variant of the sixth embodiment. FIG. 15(a) is an expanded plan view of flexible wiring boards F1 and F2. FIG. 15(b) is a cross-sectional view of FIG. 15(a) in the second direction Y. FIG. 15(c) is a cross-sectional view of FIG. 15(a) in the first direction X. The structure of FIG. 15 includes, as compared to the structure of FIG. 14, grooves GR1 and GR2 do not overlap with IC chips IC1 and IC2.

As in FIG. 15(a), the groove GR1 is arranged to avoid the IC chip IC1. The groove GR2 is arranged to avoid the IC chip IC2. Furthermore, as in (b) and (c) of FIG. 15, the base member BS1 includes an island part IS1 surrounded by the groove GR1. The island part IS1 overlaps with the IC chip IC1. The base member BS2 includes an island part IS2 surrounded by the groove GR2. The island part IS2 overlaps with the IC chip IC2. With such island parts IS1 and IS2, the IC chips IC1 and IC2 are supported.

The first variant of the sixth embodiment as above can achieve the aforementioned advantages of the first embodiment.

FIG. 16 illustrates flexible wiring boards F1 and F2 of a second variant of the sixth embodiment. FIG. 16(a) is an expanded plan view of flexible wiring boards F1 and F2. FIG. 16(b) is a cross-sectional view of FIG. 16(a) in the second direction Y. FIG. 16(c) is a cross-sectional view of FIG. 16(a) in the first direction X. The structure of FIG. 16 includes, as compared to the structure of FIG. 14, grooves GR1 and GR2 with different shapes.

As in FIG. 16(a), the groove GR1 overlaps with a part of the IC chip IC1. The groove GR2 overlaps with a part of the IC chip IC2. Furthermore, as in (a) to (c) of FIG. 16, the structure of the grooves GR1 and GR2 is similar to the structure of Grooves GR1 and GR2 shown in FIG. 10.

The second variant of the sixth embodiment as above can achieve the aforementioned advantages of the first embodiment.

Figure 17:
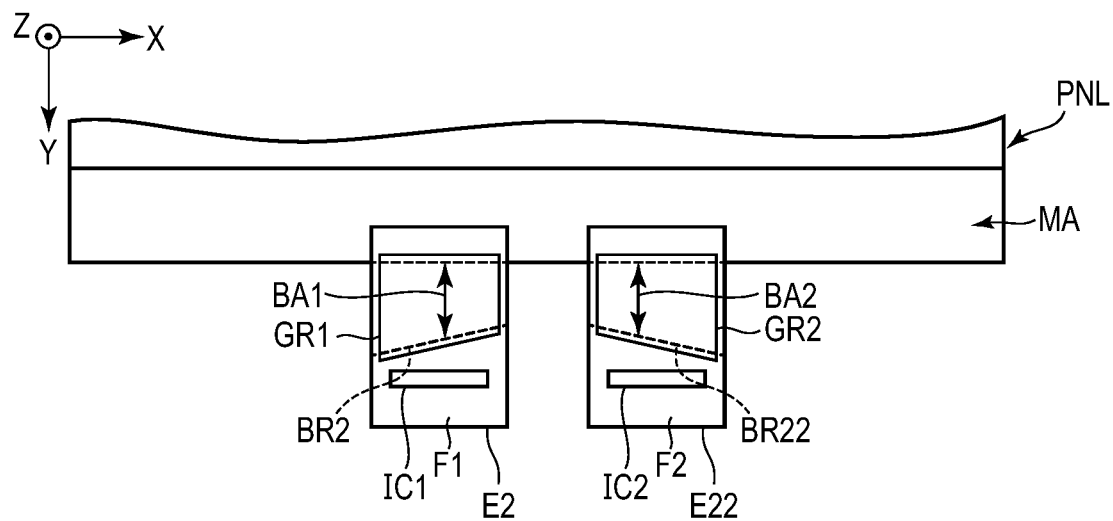
FIG. 17 is a diagram illustrating a flexible wiring board of a third variant of the sixth embodiment.

FIG. 17 illustrates flexible wiring boards F1 and F2 of a third variant of the sixth embodiment. The structure of FIG. 17 includes, as compared to the structure of FIG. 14(a), IC chips IC1 and IC2 are arranged in positions which do not overlap with the bending parts BA1 and BA2.

The IC chip IC1 is positioned between the bending boundary BR2 and the end E2. The IC chip IC2 is positioned between the bending boundary BR22 and the end E22. Note that, the arrangement of the IC chips of FIG. 17 and any of the structures of the first to fifth embodiments may be combined.

The third variant of the sixth embodiment as above can achieve the aforementioned advantages of the first embodiment.

Now, a manufacturing method of aforementioned grooves GR of flexible wiring boards F will be explained.

The groove GR can be formed by, in the atmosphere, irradiating UV laser onto the surface of a base member BS to perform partial removal treatment and linearity treatment of the base member BS. For example, laser of 25 μm diameter dot pattern is irradiated finely to form a substantially flat groove GR. Parameters of the laser such as output, scanning speed, frequency, and number of printing are adjusted to form the grooves GR of desired treatment depth, size, and pattern.

Furthermore, the diameter of the laser may be increased/decreased instead of aforementioned 25 μm diameter to form the grooves GR of desired treatment depth, size, and pattern. Furthermore, an alignment mechanism may be adopted to finely treat arbitrary positions. Thereby, cutting or short circuit of the flexible wiring boards F and lines WR during the groove GR forming process can be suppressed. Furthermore, the forming process can be performed within the minimum steps. For example, wavelength of the laser is THG, SHG, 1064 nm. Furthermore, types of the laser can be selected based on the characteristics of the target material.

Figure 18:
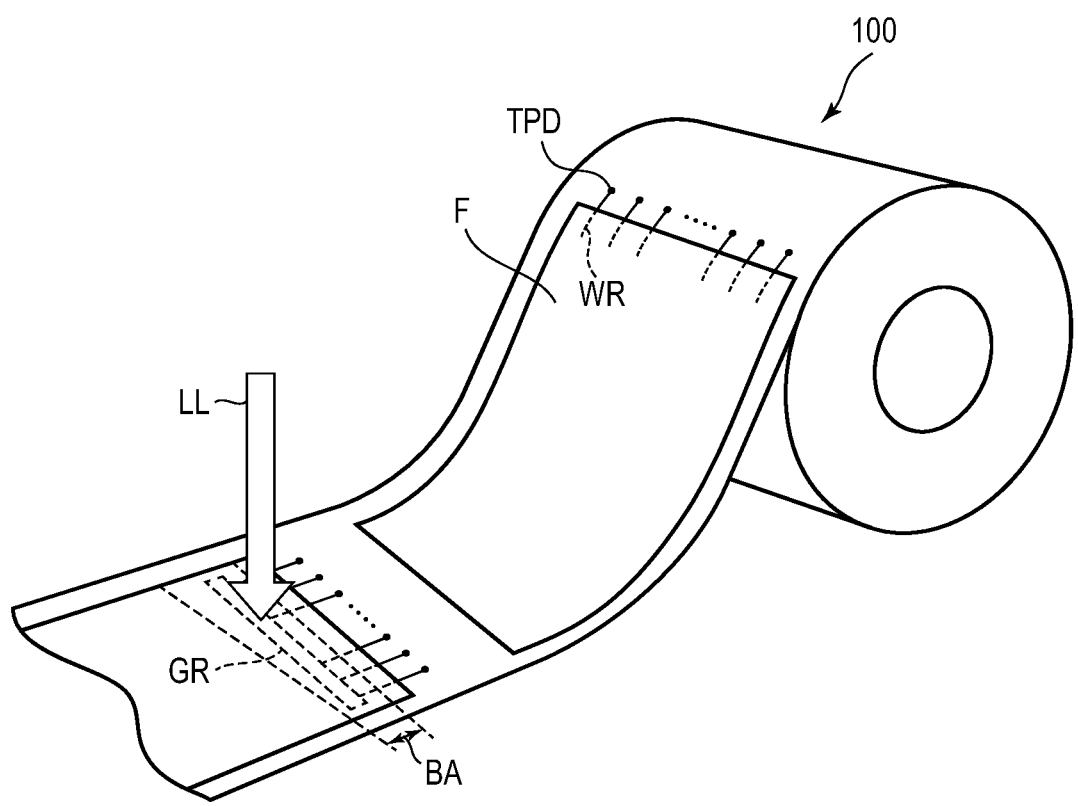
FIG. 18 is a diagram illustrating a first example of a process of forming a groove in a flexible wiring board.

FIG. 18 illustrates a first example of the process of forming the groove GR in the flexible wiring board F.

A mother substrate 100 used to form the flexible wiring board F is wrapped around a reel. A plurality of flexible wiring boards F are formed by die-cutting one mother substrate 100. The mother substrate 100 includes the base member BS, line WR, and protection layer PR which are shown in FIG. 2. A test pad TPD used to test electrical conductivity of the flexible wiring boards F is arranged outside the flexible wiring board F. A plurality of lines WR are drawn to the outside of the flexible wiring boards F to be connected to the test pad TPD. In the example of FIG. 18, laser LL is irradiated onto the flexible wiring boards F to form the grooves GR before the flexible wiring boards F is cut from the mother substrate 100.

FIG. 19 illustrates a second example of the process of forming the groove GR in the flexible wiring board F.

In the example of FIG. 19, laser LL is irradiated onto a single flexible wiring board F to form the groove GR. That is, after cutting the flexible wiring board F from the mother substrate 100 as in FIG. 18, or before mounting the flexible wiring board F on the display panel PNL, the groove GR is formed.

FIG. 20 illustrates a third example of the process of forming the groove GR in the flexible wiring board F.

In the example of FIG. 20, after mounting flexible wiring boards F1 and F2 on the display panel PNL, laser LL is irradiated onto the base member to form grooves GR1 and GR2 positioned in the bending parts BA1 and BA2. Furthermore, the grooves GR1 and GR2 are formed, in the bending areas BA1 and BA2, between the bezel areas AR1 and AR2. After the grooves GR1 and GR2 are formed, the bending parts BA1 and BA2 of the flexible wiring boards F1 and F2 are bent.

FIG. 21 illustrates a fourth example of the process of forming the groove GR in the flexible wiring board F.

In the example of FIG. 21, after the flexible wiring boards F1 and F2 are bent, grooves GR1 and GR2 are formed by laser LL in flexible wiring boards F1 and F2. Or, at the last stage of the manufacturing process of the display device DSP, grooves GR1 and GR2 are formed by the laser LL in the flexible wiring boards F1 and F2.

The aforementioned process of forming the groove GR by laser LL may be performed by a laser mechanism alone, or may be performed in a mount machine used to mount the flexible wiring boards onto the display panels PNL. Furthermore, a laser mechanism may be arranged in an arbitrary position of the machine used to manufacture the display device DSP. The process of FIGS. 18 to 21 can be applied to all of the patterns of the grooves GR described above. Note that, in the aforementioned embodiments, the patterns of the grooves GR of FIGS. 9 to 11, and 13 are formed within a small irradiation range of laser, and thus, an irradiation time of laser can be shortened, and the process can be shortened as well.

As explained above, according to the embodiments, a display device with improved reliability, flexible wiring board with improved reliability, and manufacturing method of such a display device can be achieved.

Note that, in the explanation of the embodiments, the display device and the flexible wiring board have been used for example, however, the embodiments can be applied to electronic devices such as a touch panel with a curved surface.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
a display panel including a curved display surface, a mount side curved to correspond to the curved shape of the display surface, and a plurality of pad parts aligned along the mount side;
a flat circuit board opposed to a surface opposite to the display surface of the display panel; and
a first flexible wiring board including a first end and a second end which is opposite to the first end, the first flexible wiring board mounted on the display panel and connected to the pad part in the first end side while being connected to the circuit board in the second end side, wherein
the first flexible wiring board includes a first base member including a first surface and a second surface opposite to the first surface, a first line positioned in the first surface side of the first base member, a first protection layer covering the first line, a first bending part to be bent between a first bending boundary in the first end side and a second bending boundary in the second end side, a first side edge extending from the first end to the second end, and a second side edge positioned in the opposite side of the first side edge and extending from the first end to the second end,
an extension direction of the second bending boundary is inclined with respect to an extension direction of the first bending boundary,
the first base member includes a first groove positioned in the first bending part and formed in the second surface, a first bezel area between the first side edge and the first groove, and a second bezel area between the second side edge and the first groove, and
the first groove is positioned between the first bezel area and the second bezel area.

2. The display device of claim 1, further comprising:
a second flexible wiring board including a third end and a fourth end opposite to the third end, the second flexible wiring board mounted on the display panel in the third end side to overlap with the pad part, and mounted on the circuit board in the fourth end side, wherein
the second flexible wiring board includes a second base member including a third surface and a fourth surface which is opposite to the third surface, a second line positioned in the third surface side of the second base member, and a second protection layer covering the second line, and includes a second bending part to be bent between a third bending boundary in the third end side and a fourth bending boundary in the fourth end side,
an extension direction of the fourth bending boundary is inclined with respect to an extension direction of the third bending boundary, and the second base member includes a second groove positioned in the second bending part and formed in the fourth surface.

3. The display device of claim 1, wherein
the first groove includes a first side wall extending along the first bending boundary and a second side wall extending along the second bending boundary while overlapping with the first bending boundary and the second bending boundary, and
an extension direction of the second side wall is inclined with respect to an extension direction of the first side wall.

4. The display device of claim 1, wherein the first groove includes a first part extending to overlap with the first bending boundary and a second part extending to overlap with the second bending boundary.

5. The display device of claim 1, wherein the first groove includes a bottom surface inclined with respect to the first surface.

6. The display device of claim 1, further comprising:
an IC chip mounted on the first flexible wiring board, as a signal supplier configured to supply a signal necessary to drive the display panel, wherein
the IC chip is arranged in a position to overlap with the first bending part, and
the first groove overlaps at least a part of the IC chip.

7. The display device of claim 1, further comprising:
an IC chip mounted on the first flexible wiring board, as a signal supplier configured to supply a signal necessary to drive the display panel, wherein
the IC chip is arranged in a position to overlap with the first bending part, and
the first groove does not overlap with the IC chip.

8. The display device of claim 1, further comprising:
an IC chip mounted on the first flexible wiring board, as a signal supplier configured to supply a signal necessary to drive the display panel, wherein
the IC chip is arranged in a position which does not overlap with the first bending part.

9. A flexible wiring board comprising:
a first end;
a second end in the opposite side of the first end;
a first base member including a first surface and a second surface opposite to the first surface;
a first line positioned in the first surface side of the first base member;
a first protection layer covering the first line;
a first bending part bent between a first bending boundary in the first end side and a second bending boundary in the second end side; and
a first side edge extending from the first end to the second end, and a second side edge positioned in the opposite side of the first side edge and extending from the first end to the second end, wherein
an extension direction of the second bending boundary is inclined with respect to an extension direction of the first bending boundary,
the first base member includes a first groove positioned in the first bending part and formed in the second surface, a first bezel area between the first side edge and the first groove, and a second bezel area between the second side edge and the first groove, and
the first groove is positioned between the first bezel area and the second bezel area.

10. The flexible wiring board of claim 9, wherein
the first groove includes a first side wall extending along the first bending boundary and a second side wall extending along the second bending boundary while overlapping the first bending boundary and the second bending boundary, and
an extension direction of the second side wall is inclined with respect to an extension direction of the first side wall.

11. The flexible wiring board of claim 9, wherein
the first groove includes a first part extending to overlap with the first bending boundary and a second part extending to overlap with the second bending boundary.

12. The flexible wiring board of claim 9, wherein the first groove includes a bottom surface inclined with respect to the first surface.

13. The flexible wiring board of claim 9, further comprising:
an IC chip arranged in a position overlapping with the first bending part, wherein
the first groove overlaps at least a part of the IC chip.

14. The flexible wiring board of claim 9, further comprising:
an IC chip arranged in a position overlapping with the first bending part, wherein
the first groove does not overlap with the IC chip.

15. The flexible wiring board of claim 9, further comprising:
an IC chip arranged in a position which does not overlap with the first bending part.

16. A manufacturing method of a display device, the display device including
a display panel including a curved display surface, a mount side curved to correspond to the curved shape of the display surface, and a plurality of pad parts aligned along the mount side,
a flat circuit board opposed to a surface opposite to the display surface of the display panel, and
a flexible wiring board including a first end, a second end in the opposite side of the first end, a first side edge extending from the first end to the second end, and a second side edge positioned in the opposite side of the first side edge and extending from the first end to the second end, the flexible wiring board mounted on the display panel in the first end side to be connected to the pad part, and connected to the circuit board in the second end side, wherein
the flexible wiring board includes a base member including a first surface and a second surface opposite to the first surface, a first line positioned in the first surface side of the base member, and a protection layer covering the first line, and includes a bending part to be bent between a first bending boundary in the first end side and a second bending boundary in the second end side, and
an extension direction of the second bending boundary is inclined with respect to an extension direction of the first bending boundary, wherein
the base member includes a first bezel area along the first side edge and a second bezel area along the second side edge, the method comprising:
forming a groove, by laser, in the second surface of the base member to be positioned in the bending part after mounting the flexible wiring board on the display panel, between the first bezel area and the second bezel area; and bending the bending part of the flexible wiring board after the forming of the groove in the base member.

* * * * *